US 6,308,818 B1

(12) United States Patent
Bonora et al.

(10) Patent No.: US 6,308,818 B1
(45) Date of Patent: Oct. 30, 2001

(54) TRANSPORT SYSTEM WITH INTEGRATED TRANSPORT CARRIER AND DIRECTORS

(75) Inventors: Anthony C. Bonora, Menlo Park; Richard H. Gould, Fremont, both of CA (US)

(73) Assignee: Asyst Technologies, Inc., Fremont, CA (US)

(*) Notice: Subject to any disclaimer, the term of this patent is extended or adjusted under 35 U.S.C. 154(b) by 0 days.

(21) Appl. No.: 09/365,457

(22) Filed: Aug. 2, 1999

(51) Int. Cl.[7] .................................................. B65G 37/00
(52) U.S. Cl. .................. 198/465.1; 198/414; 198/867.13
(58) Field of Search .................... 198/414, 465.1–465.3, 198/803.2, 867.13

(56) References Cited

U.S. PATENT DOCUMENTS

| | | | |
|---|---|---|---|
| 3,746,148 | 7/1973 | Hilger et al. ........................... | 198/219 |
| 3,840,110 | 10/1974 | Molt et al. ......................... | 198/127 R |
| 3,927,620 | 12/1975 | Clapham ....................... | 104/148 LM |
| 3,976,330 | 8/1976 | Babinski et al. ....................... | 302/2 R |
| 4,014,428 | 3/1977 | Ossbahr ................................ | 198/345 |
| 4,093,084 | 6/1978 | Ringer ................................ | 214/11 R |
| 4,305,335 | 12/1981 | Plugge .............................. | 104/172 B |
| 4,389,941 | * 6/1983 | Berk et al. .......................... | 198/465.2 |
| 4,453,627 | 6/1984 | Wilkins ................................ | 198/781 |
| 4,461,382 | 7/1984 | Hoover et al. ........................ | 198/781 |
| 4,513,854 | 4/1985 | Prodel et al. ......................... | 198/472 |
| 4,515,264 | 5/1985 | Sticht ................................ | 198/344 |
| 4,519,491 | * 5/1985 | Prodel et al. ....................... | 198/465.1 |
| 4,530,287 | 7/1985 | Sticht ................................. | 104/168 |
| 4,534,462 | 8/1985 | Hoover et al. ........................ | 198/781 |
| 4,572,358 | 2/1986 | Swain ................................. | 198/781 |
| 4,619,205 | 10/1986 | Sticht ................................. | 104/168 |
| 4,793,262 | 12/1988 | Horn ................................. | 104/168 |
| 4,805,759 | 2/1989 | Rochet et al. ..................... | 198/346.1 |
| 4,826,360 | 5/1989 | Iwasawa et al. ....................... | 406/51 |
| 4,926,753 | 5/1990 | Weiss ................................. | 104/88 |
| 4,938,334 | * 7/1990 | McGinn .............................. | 198/414 |
| 4,940,000 | 7/1990 | Horvath et al. ...................... | 104/295 |
| 4,974,519 | 12/1990 | Miletto ............................... | 104/165 |
| 5,009,306 | * 4/1991 | Roderick et al. ..................... | 198/414 |
| 5,086,910 | 2/1992 | Terpstra ............................. | 198/572 |
| 5,129,507 | 7/1992 | Maeda et al. ........................ | 198/781 |
| 5,213,201 | 5/1993 | Huber et al. ......................... | 198/781 |
| 5,285,887 | 2/1994 | Hall .................................... | 198/460 |
| 5,318,167 | 6/1994 | Bronson et al. ..................... | 198/577 |
| 5,452,801 | 9/1995 | Horn .................................. | 206/454 |
| 5,521,563 | 5/1996 | Mazzochette ........................ | 333/116 |
| 5,533,844 | 7/1996 | Ekleberry .............................. | 409/159 |
| 5,673,804 | 10/1997 | Weiss et al. ........................ | 212/274 |

FOREIGN PATENT DOCUMENTS 0 674 069 A1   3/1994   (EP) .

* cited by examiner

*Primary Examiner*—Joseph E. Valenza
(74) *Attorney, Agent, or Firm*—Flehr Hohbach Test Albritton & Herbert LLP

(57) ABSTRACT

A director assembly for selectively directing a transport carrier from one conveyor path portion to another. The director assembly having a pair of spaced director rails positioned below and in between drive and support rails of the conveyor. The pair of spaced director rails can be selectively raised and rotated and then lowered to direct the carrier to the new path portion.

12 Claims, 20 Drawing Sheets

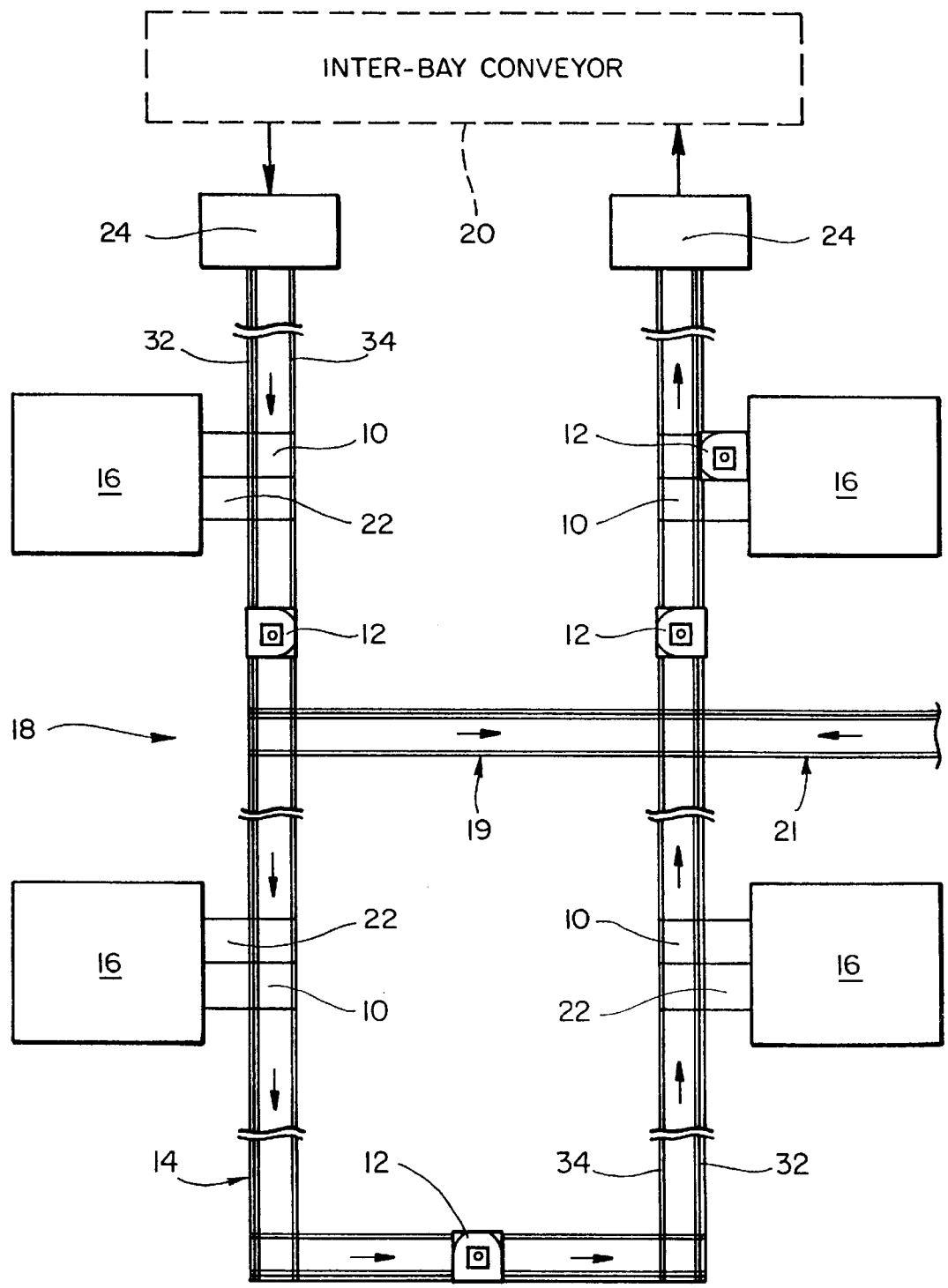
FIG_1

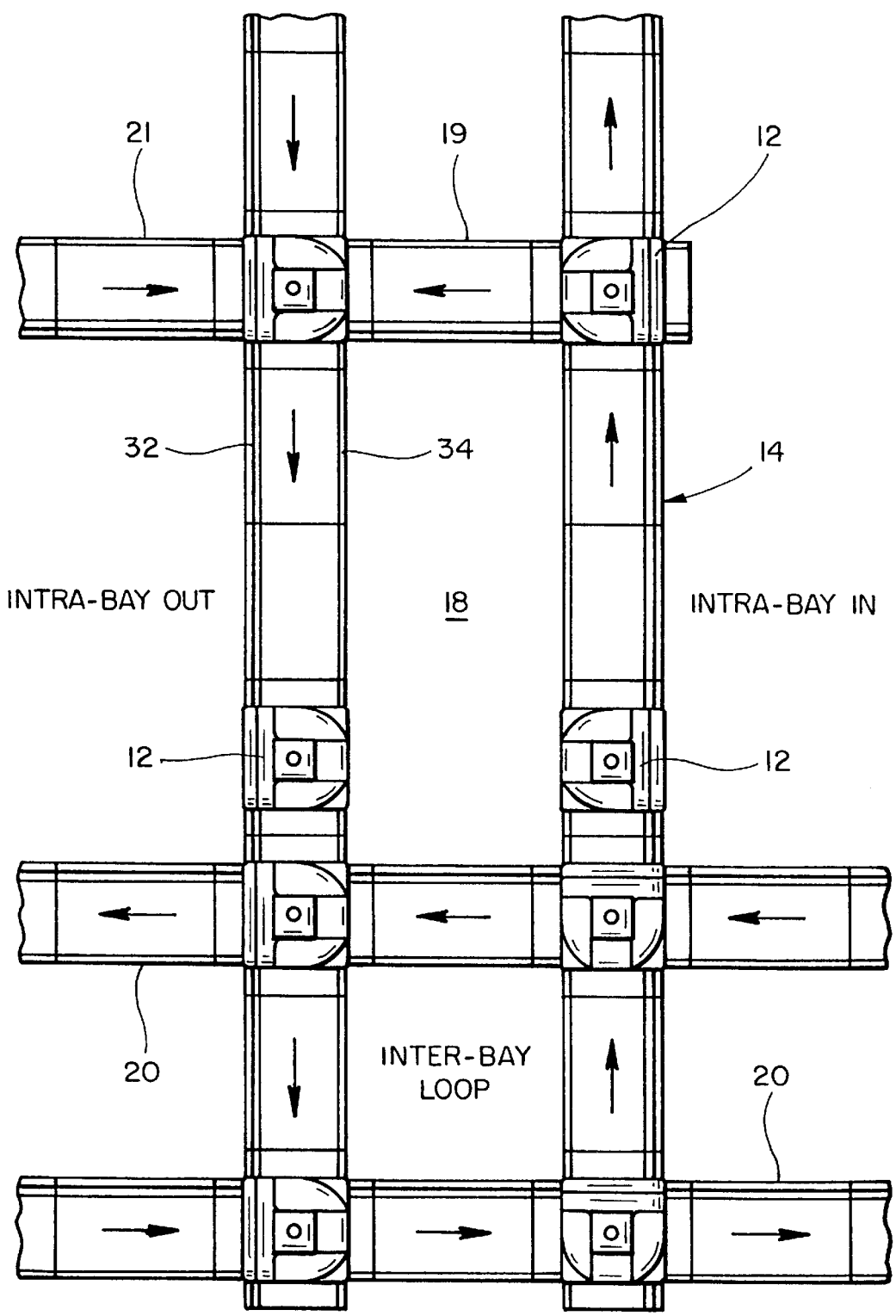
FIG_2

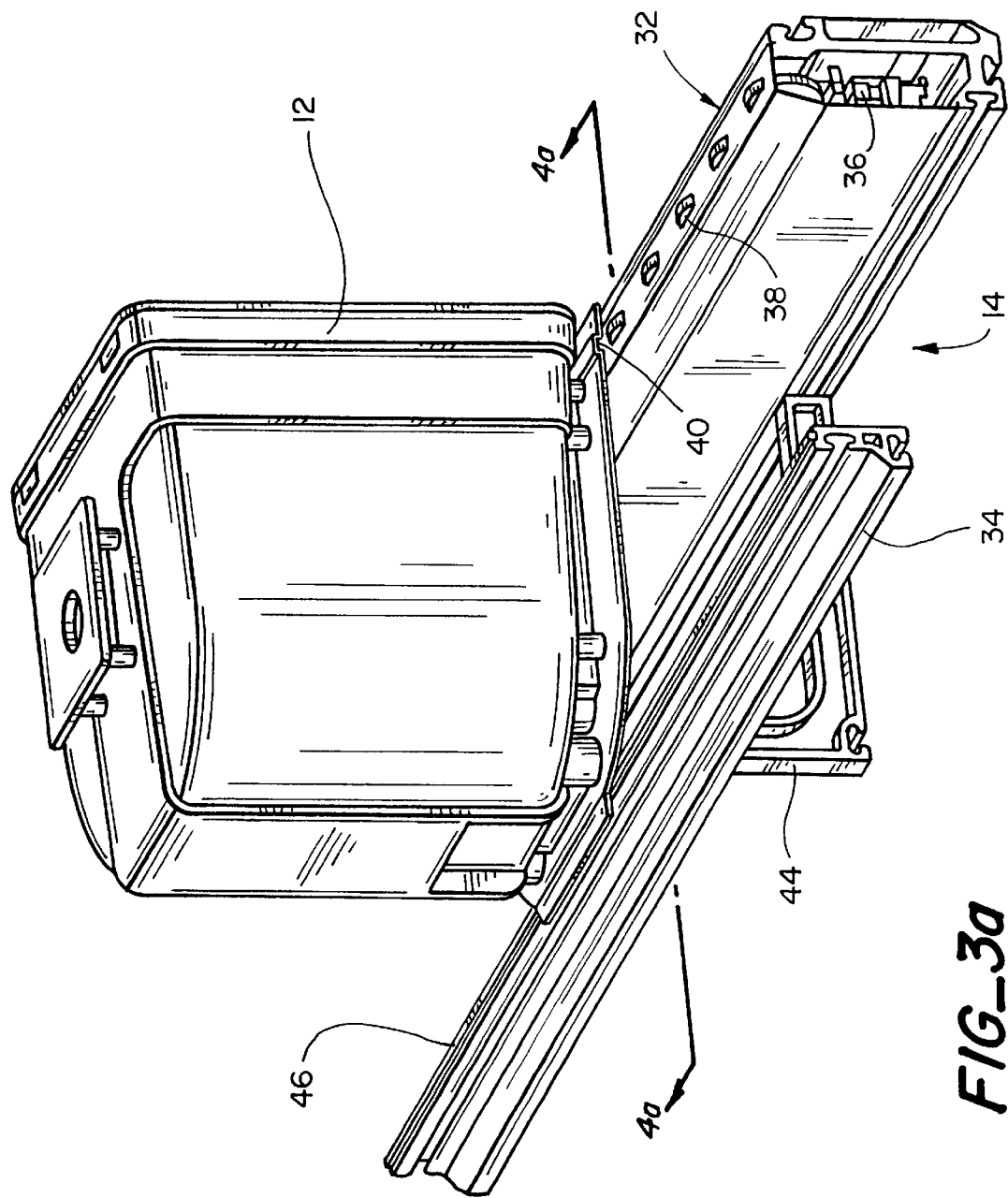
FIG_3a

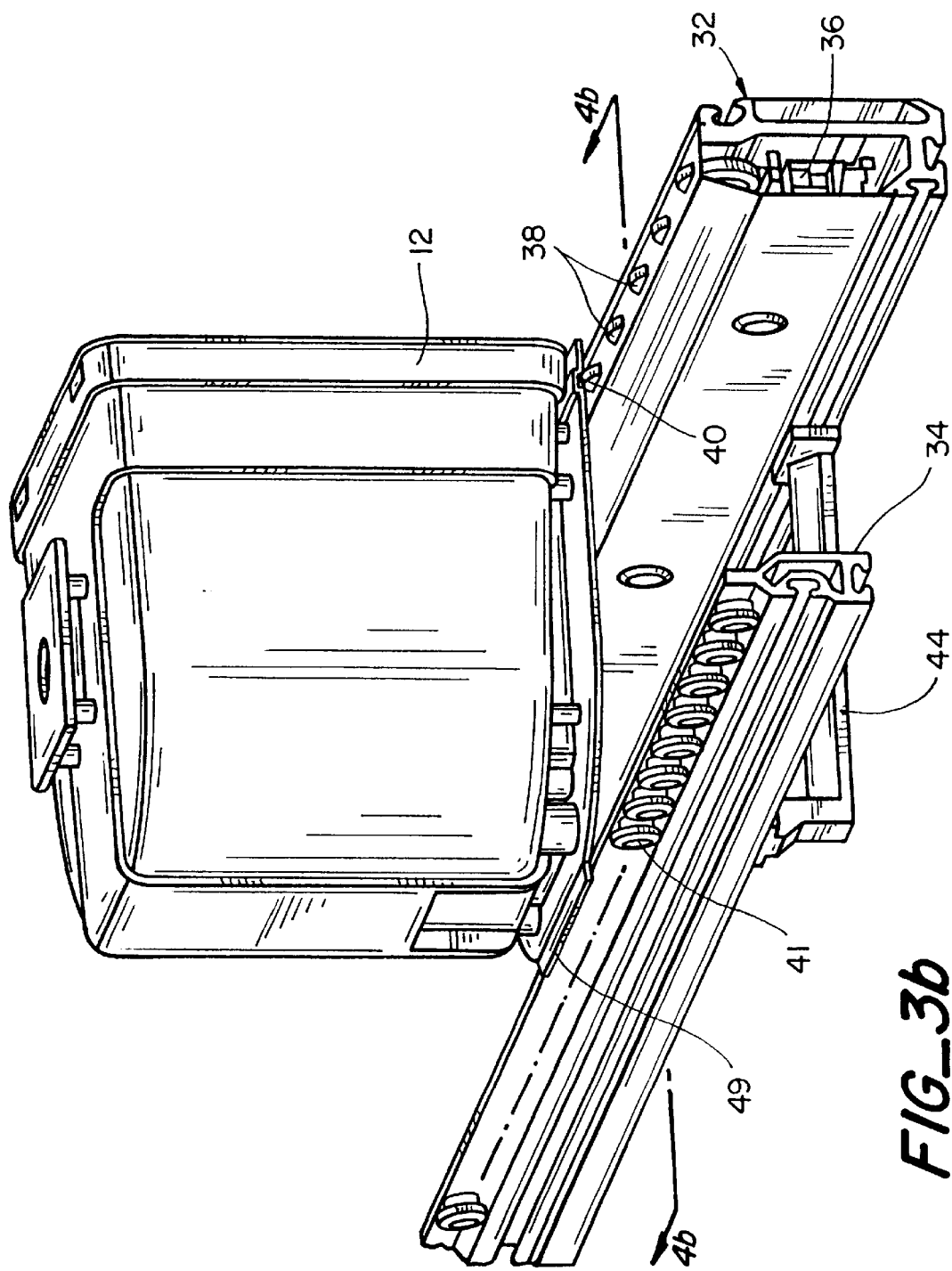

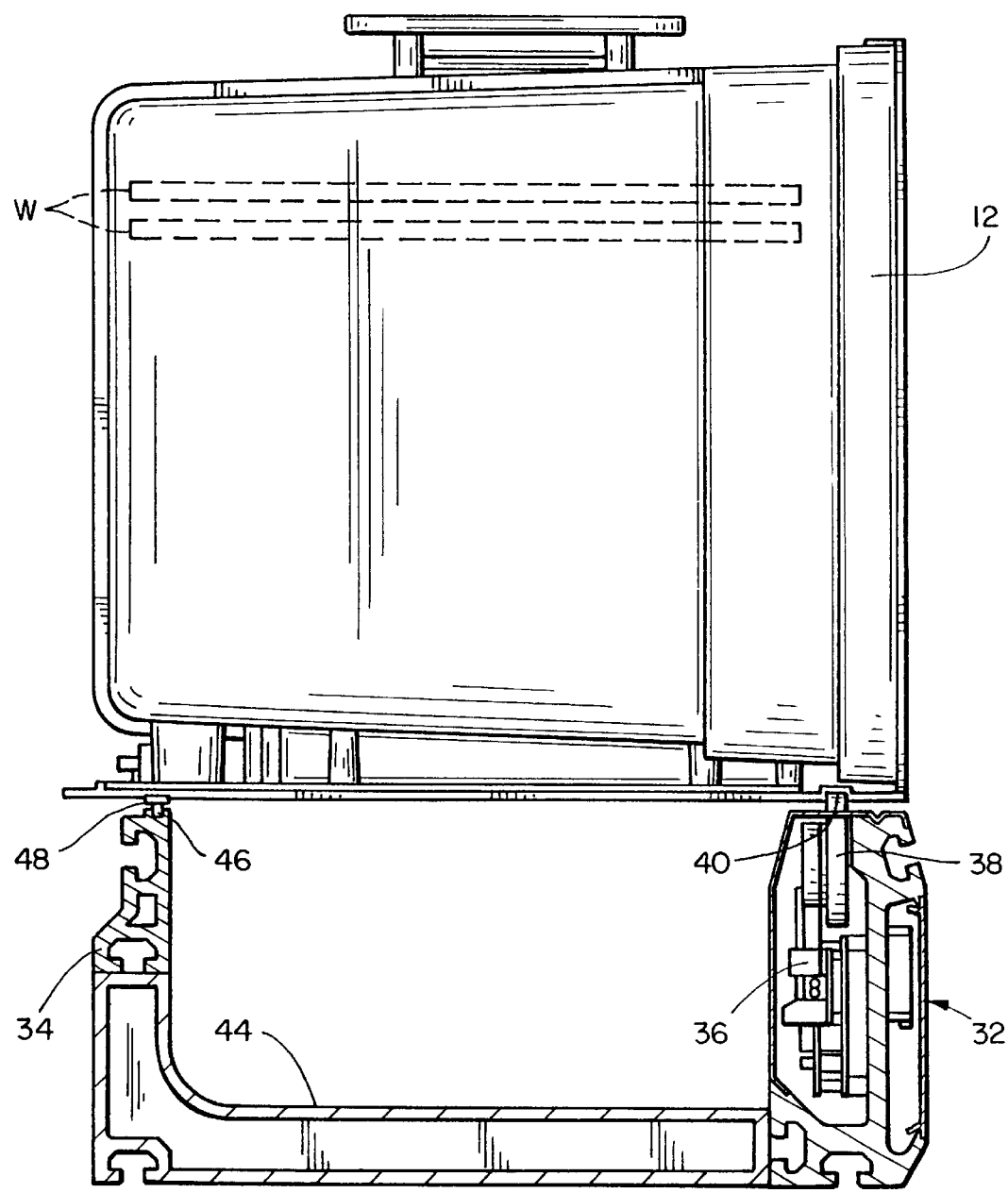
FIG_4a

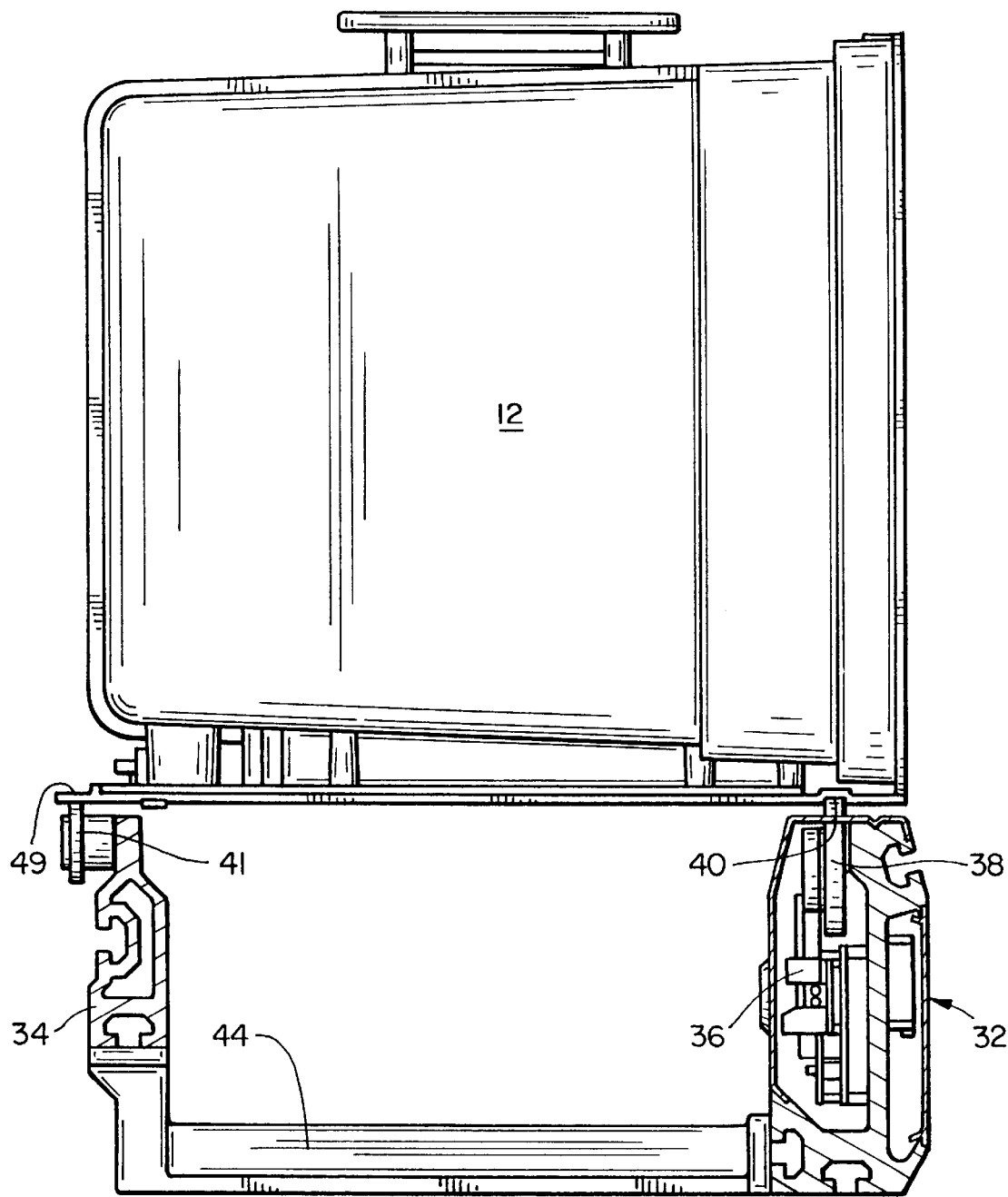
FIG_4b

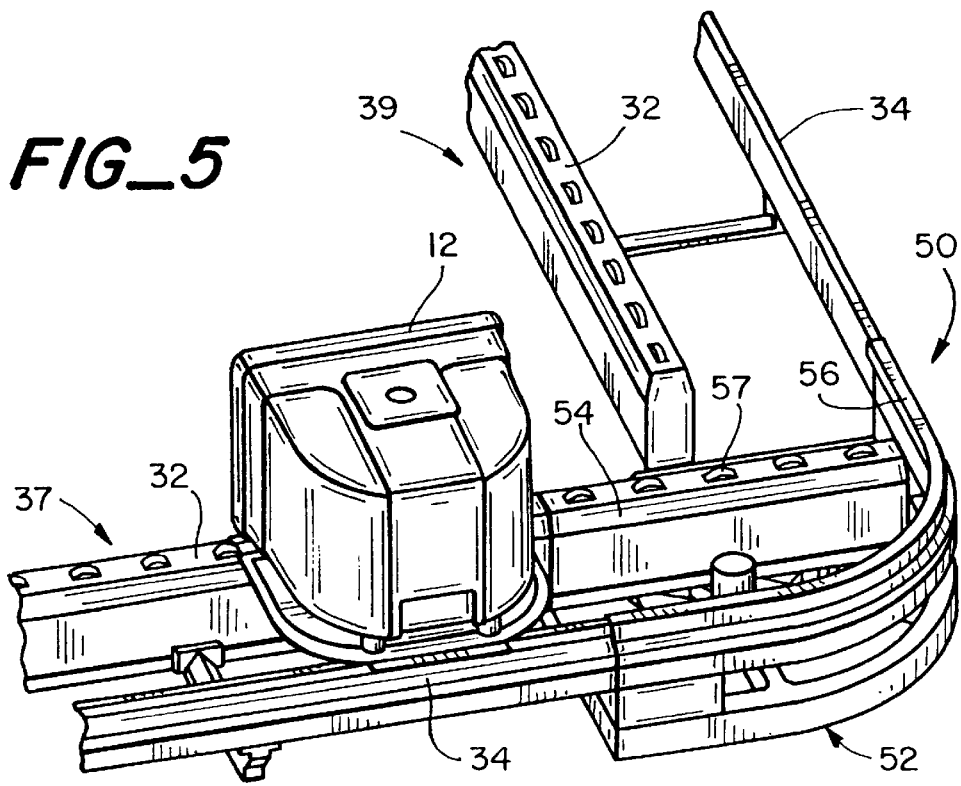
FIG_5
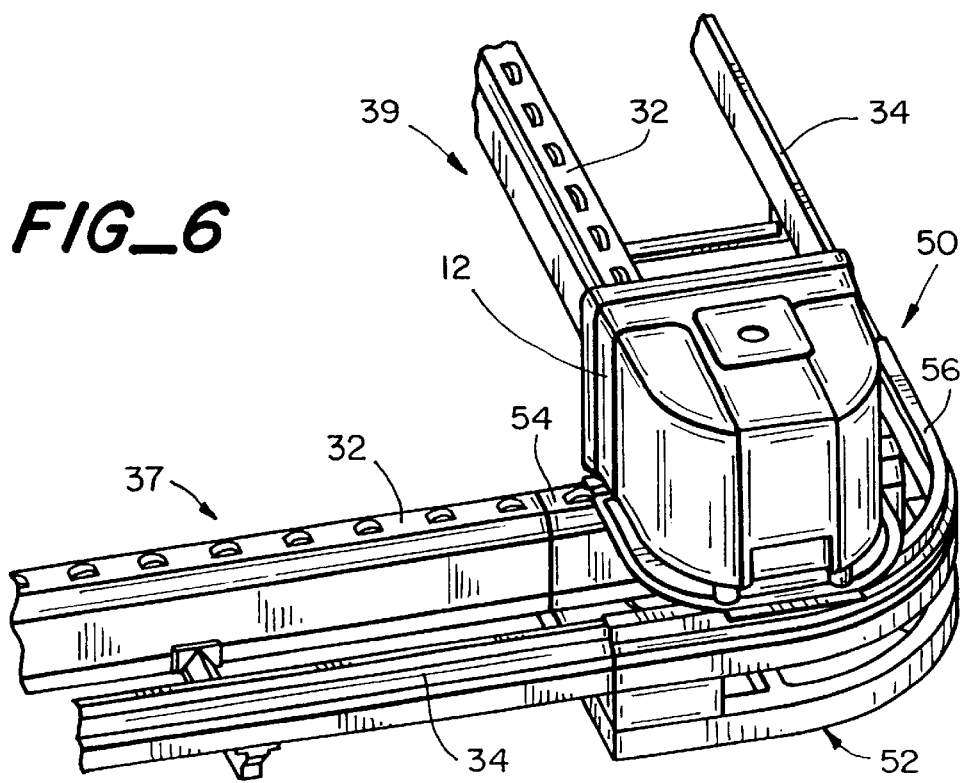
FIG_6

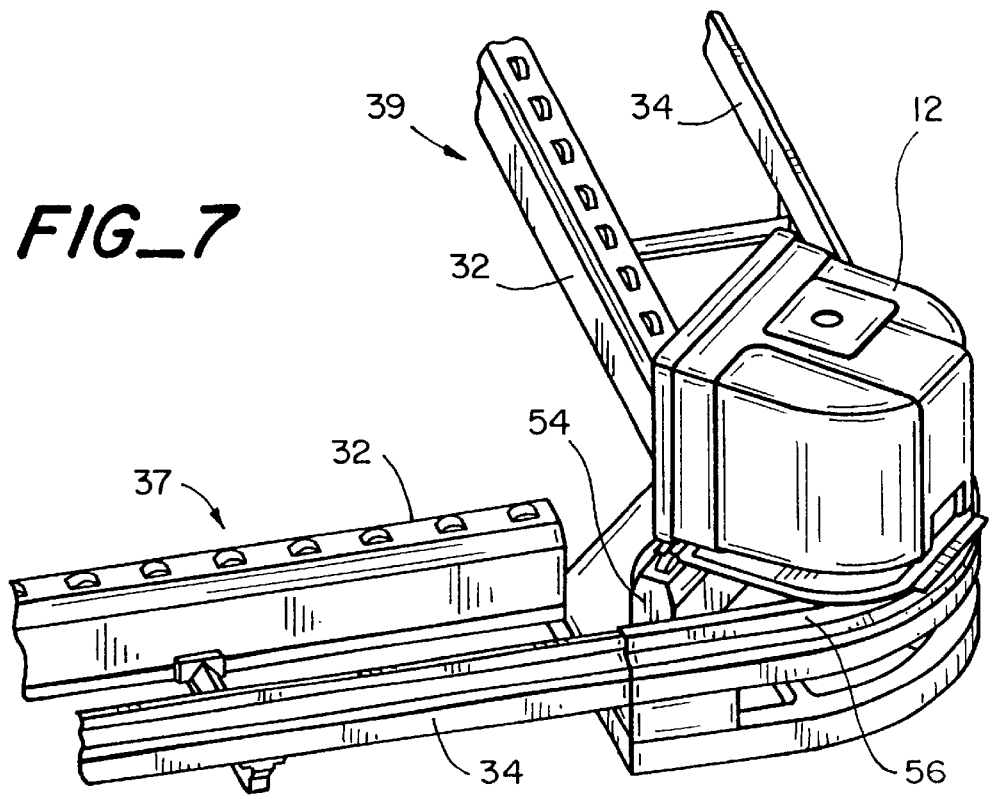
FIG_7
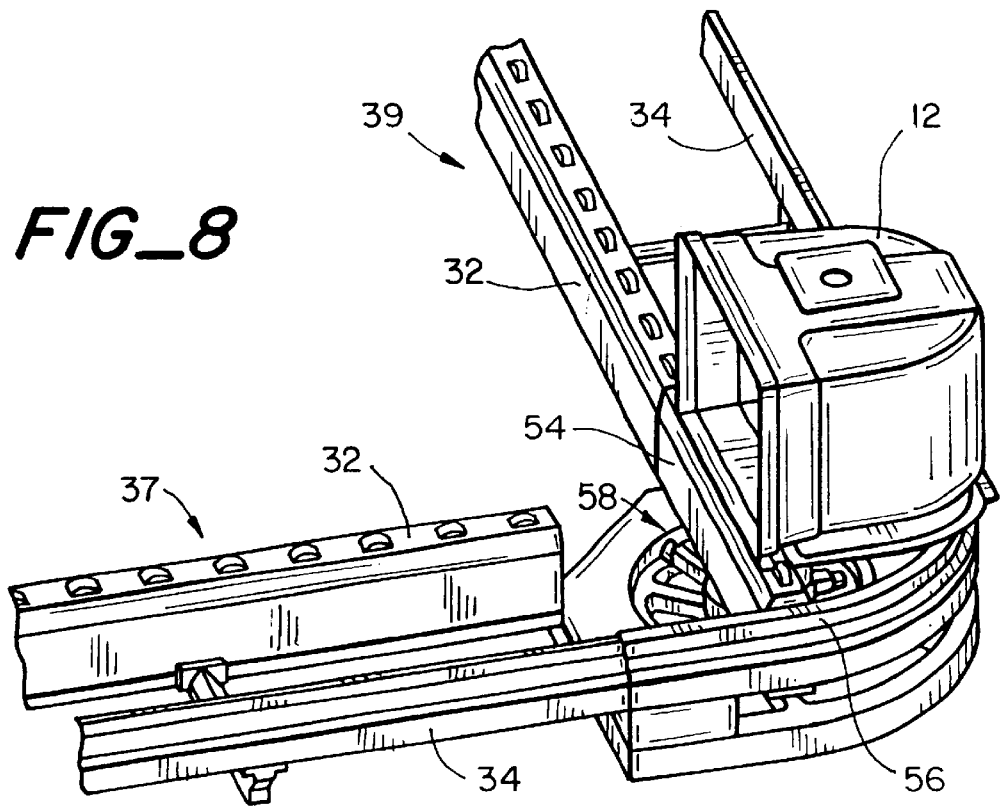
FIG_8

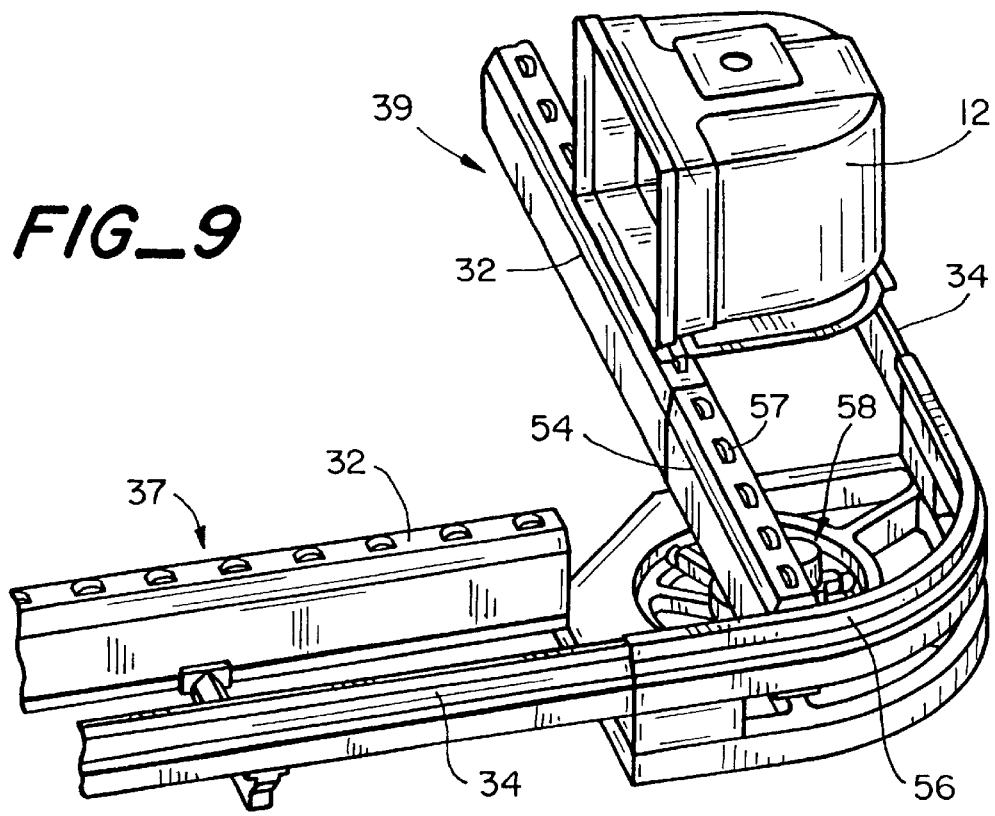
FIG_9
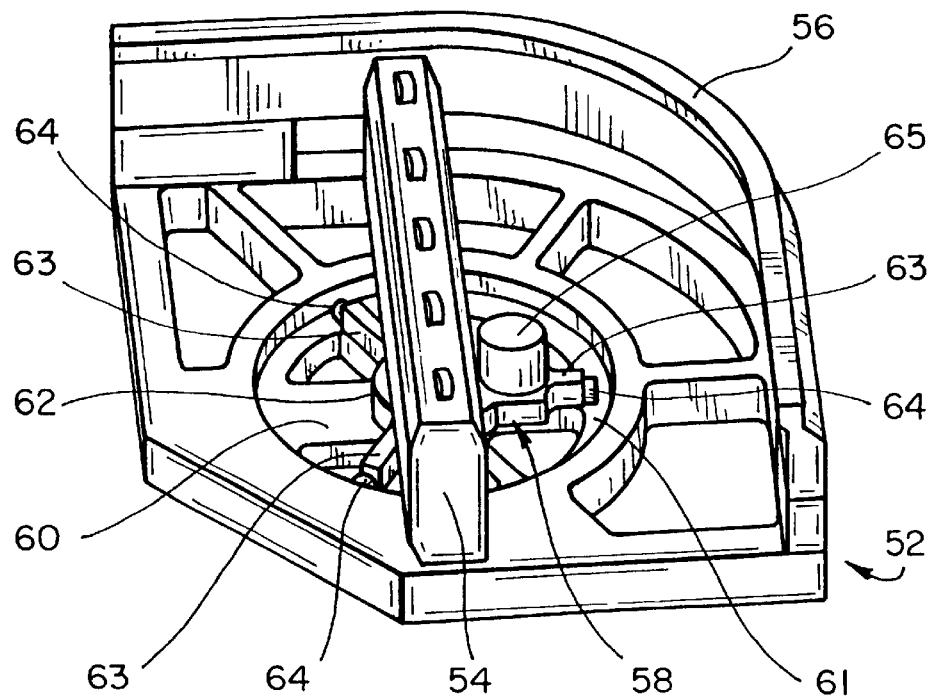
FIG_10

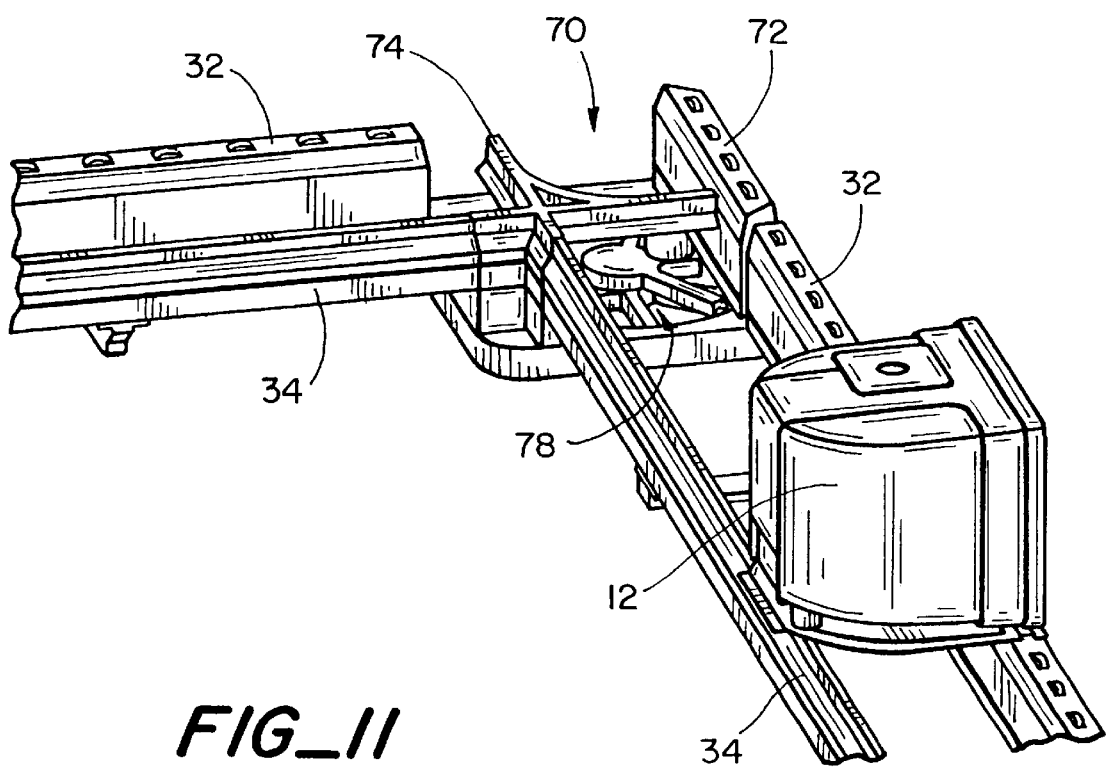
FIG_11

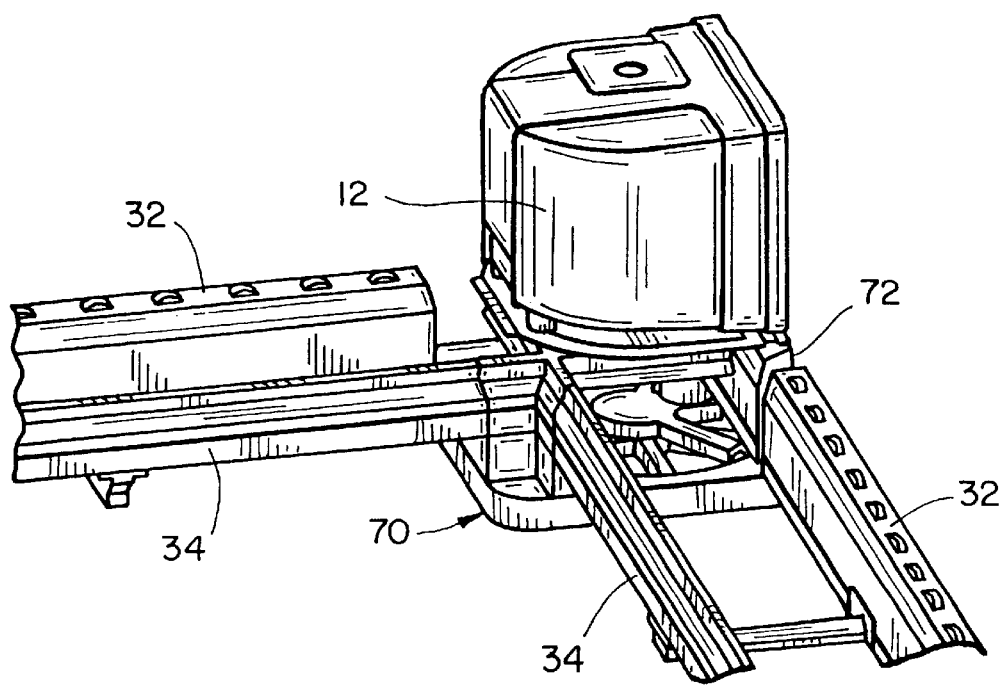
FIG_12
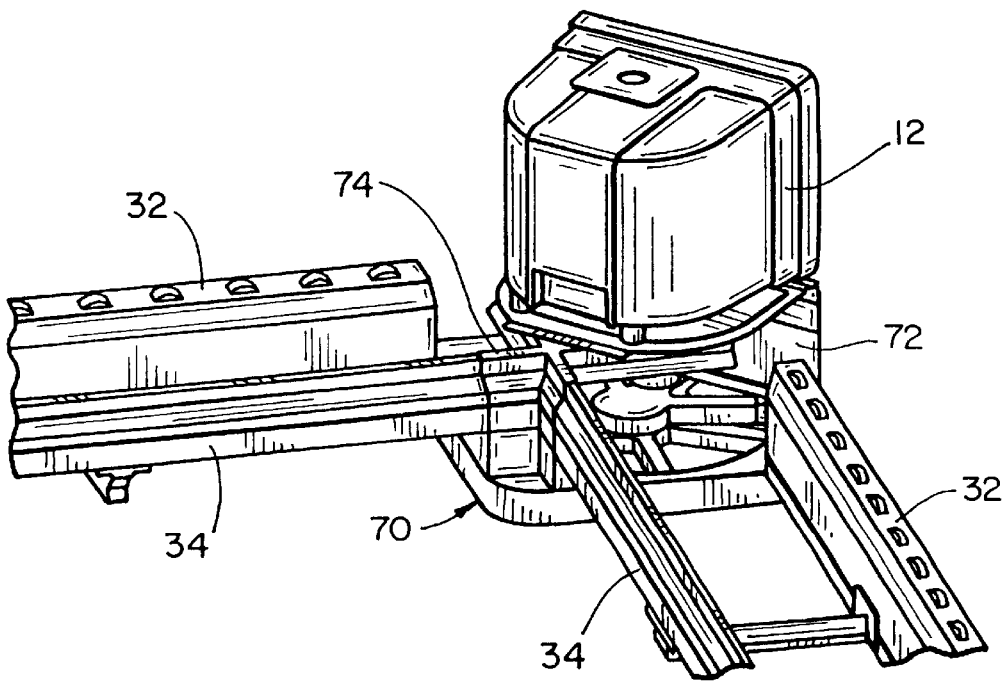
FIG_13

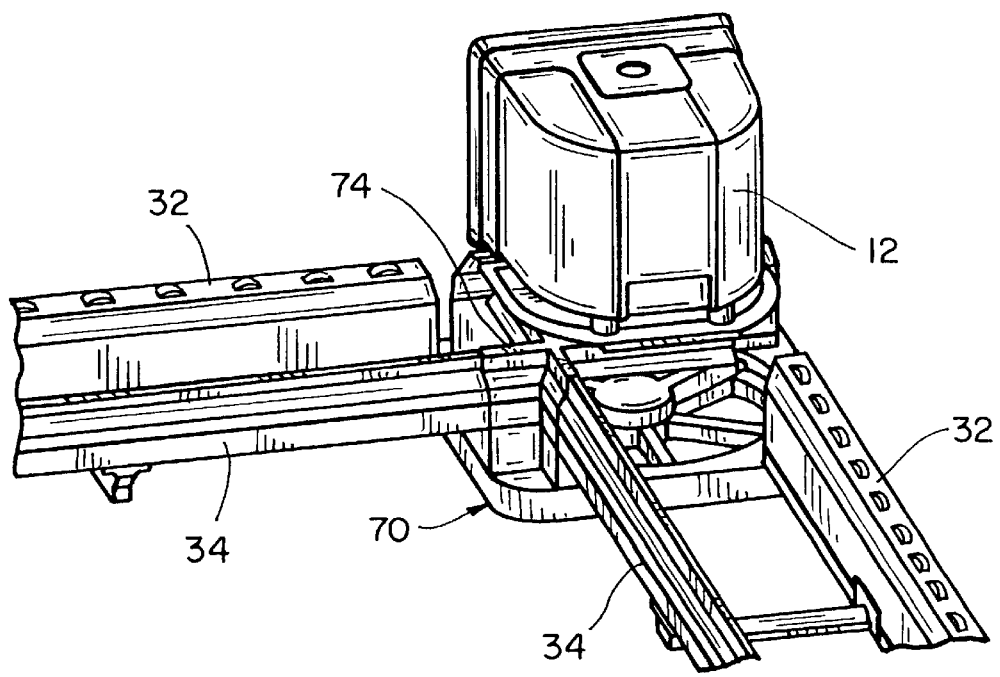
FIG_14
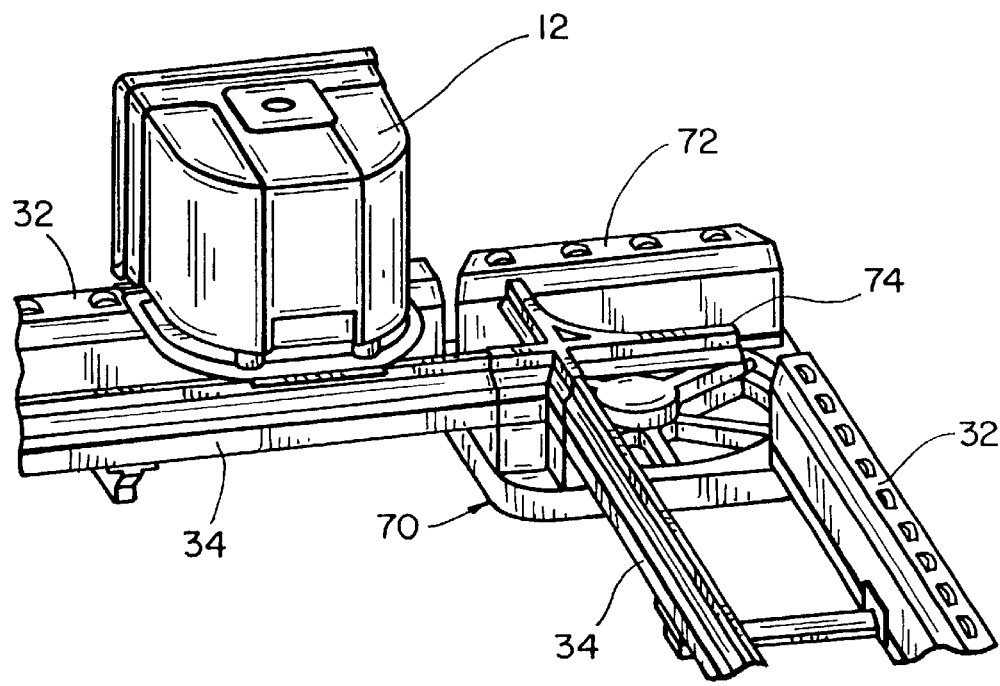
FIG_15

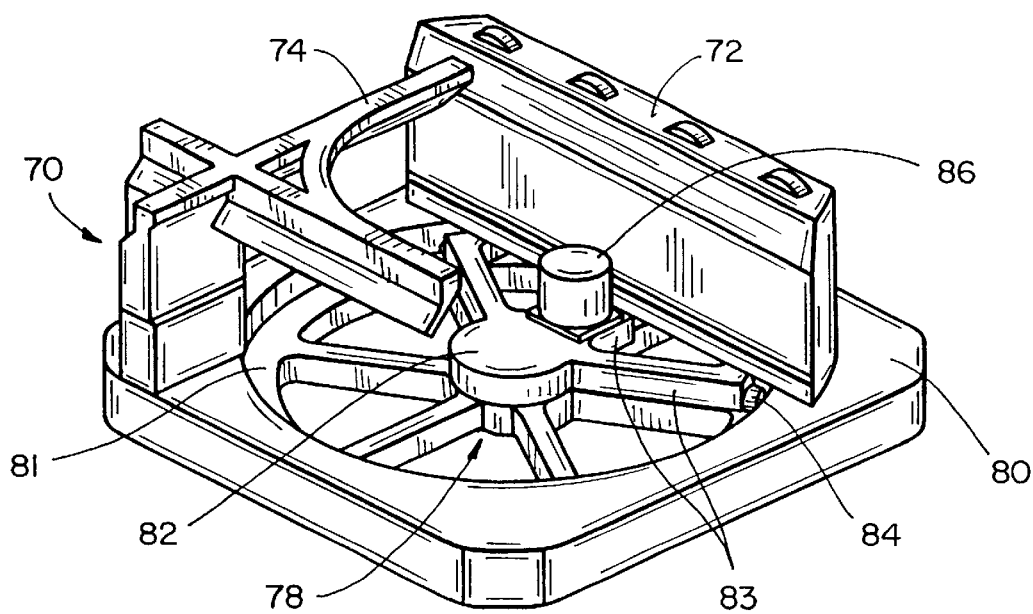
FIG_16
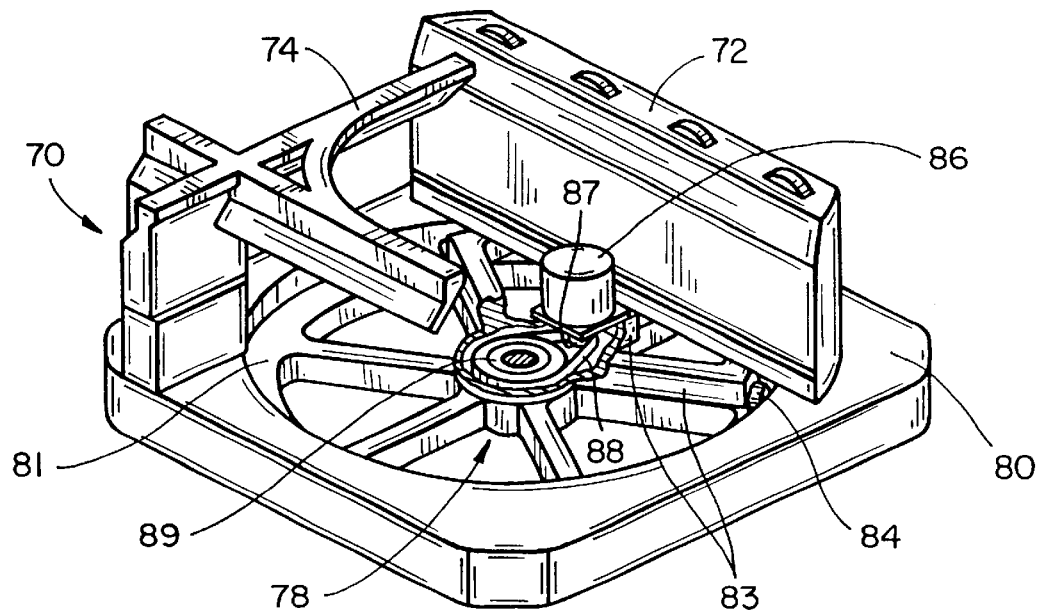
FIG_17

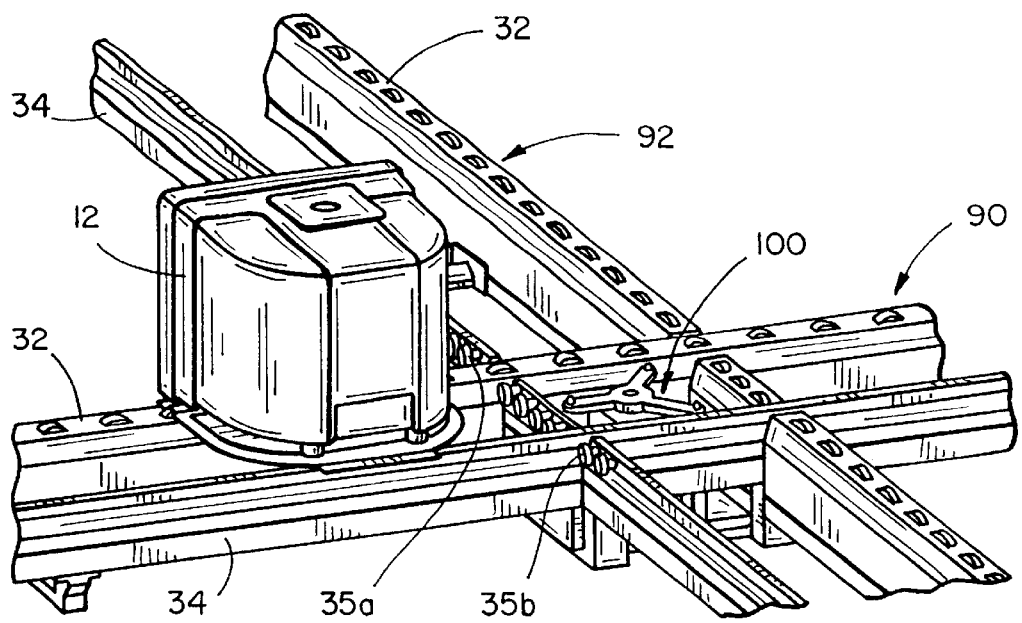
FIG_18
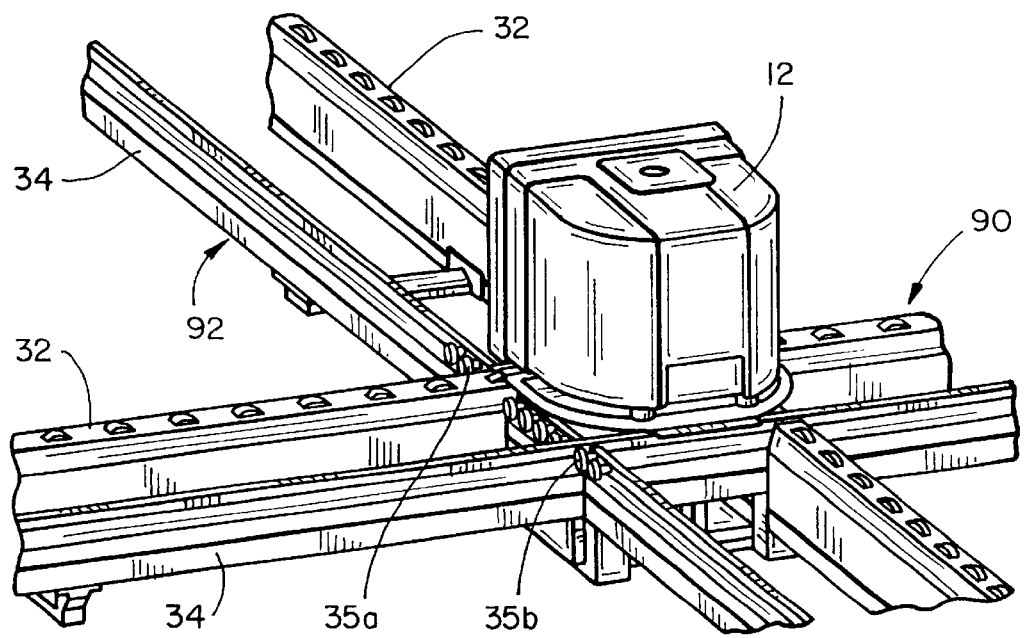
FIG_19

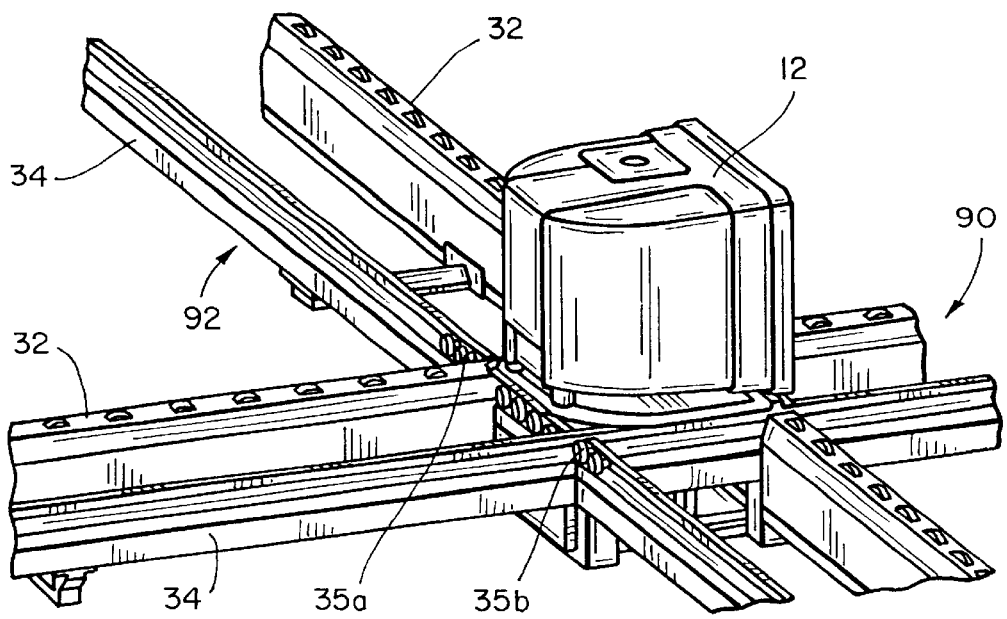
*FIG_20*
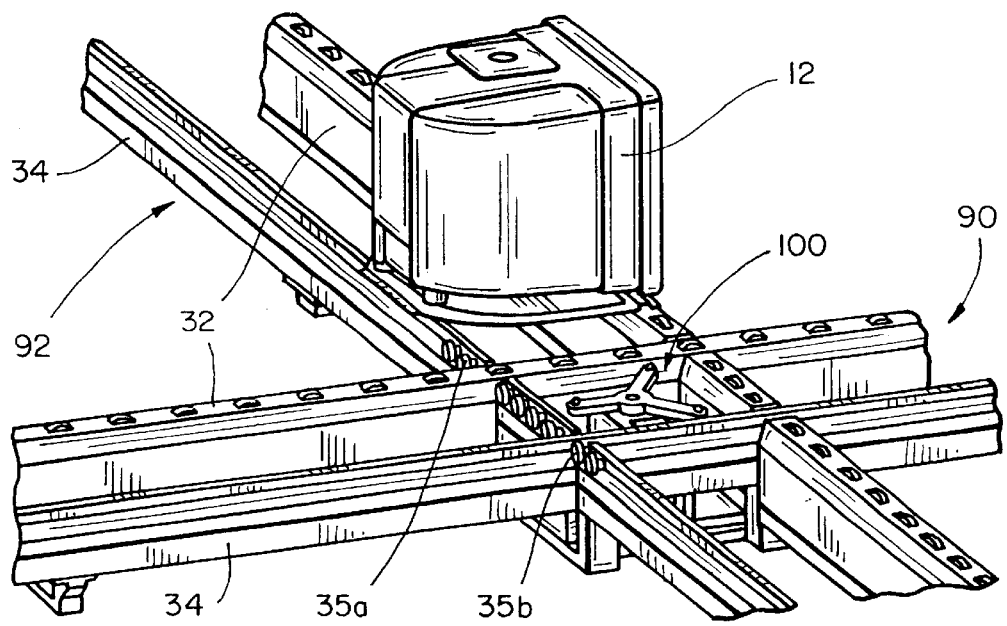
*FIG_21*

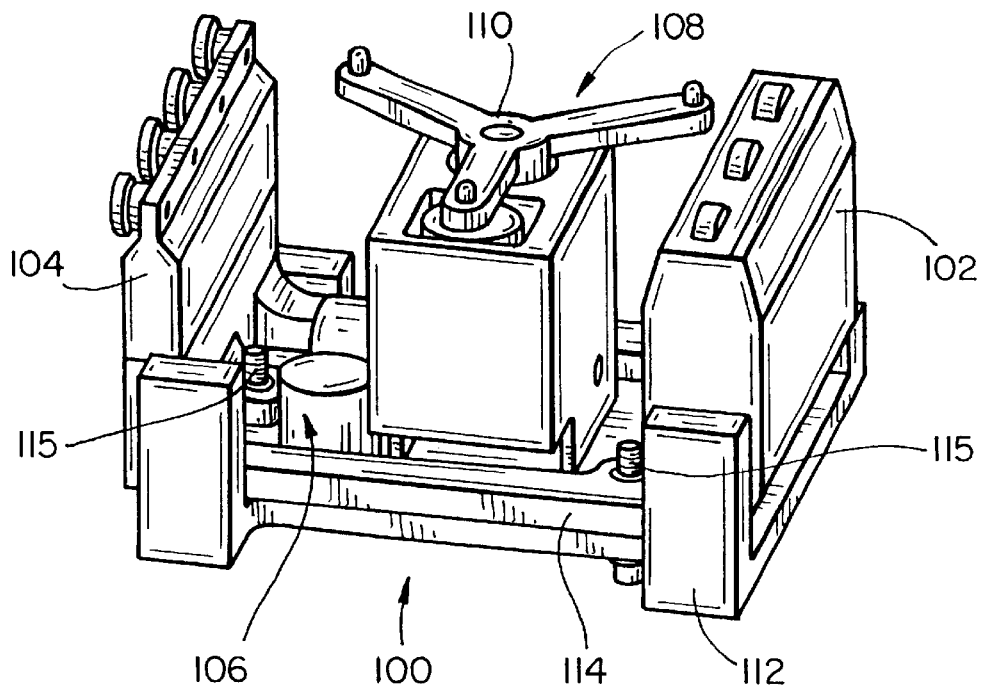
FIG_22
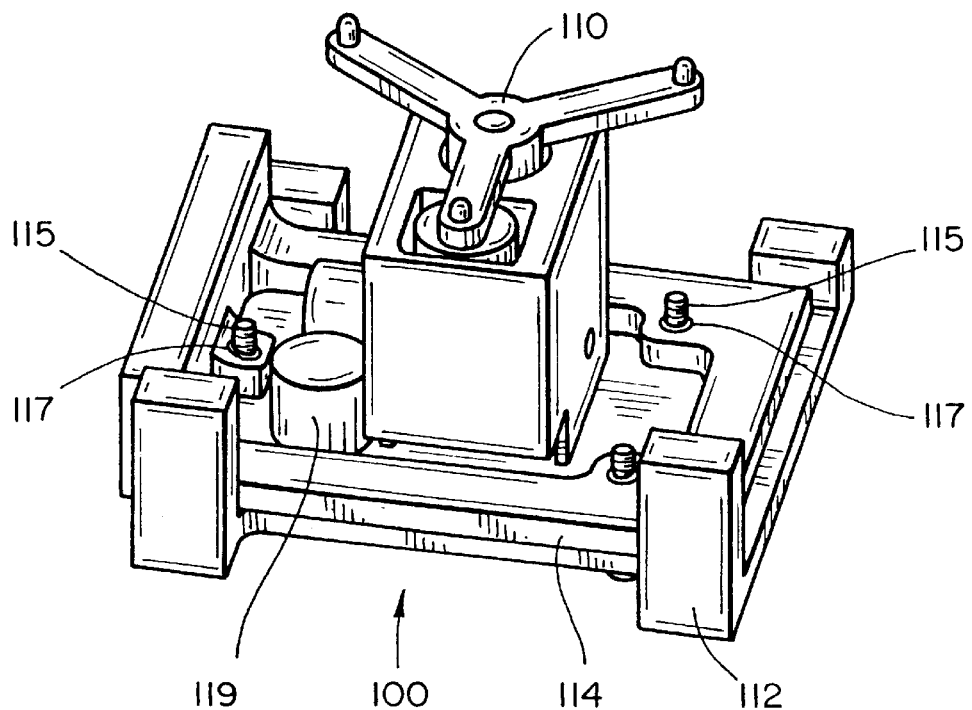
FIG_23

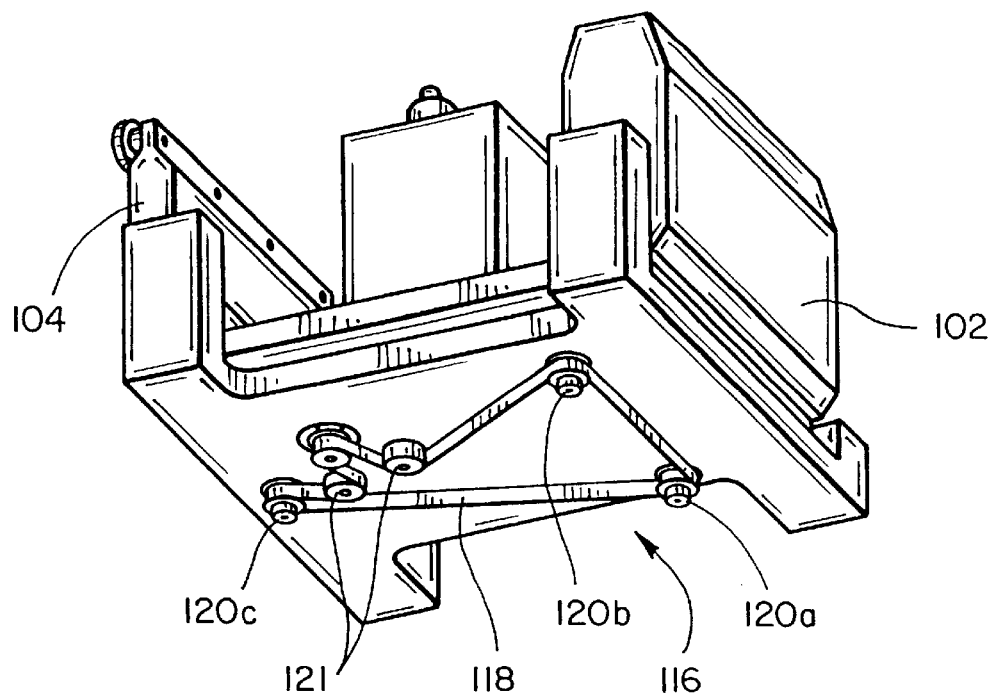
FIG_24
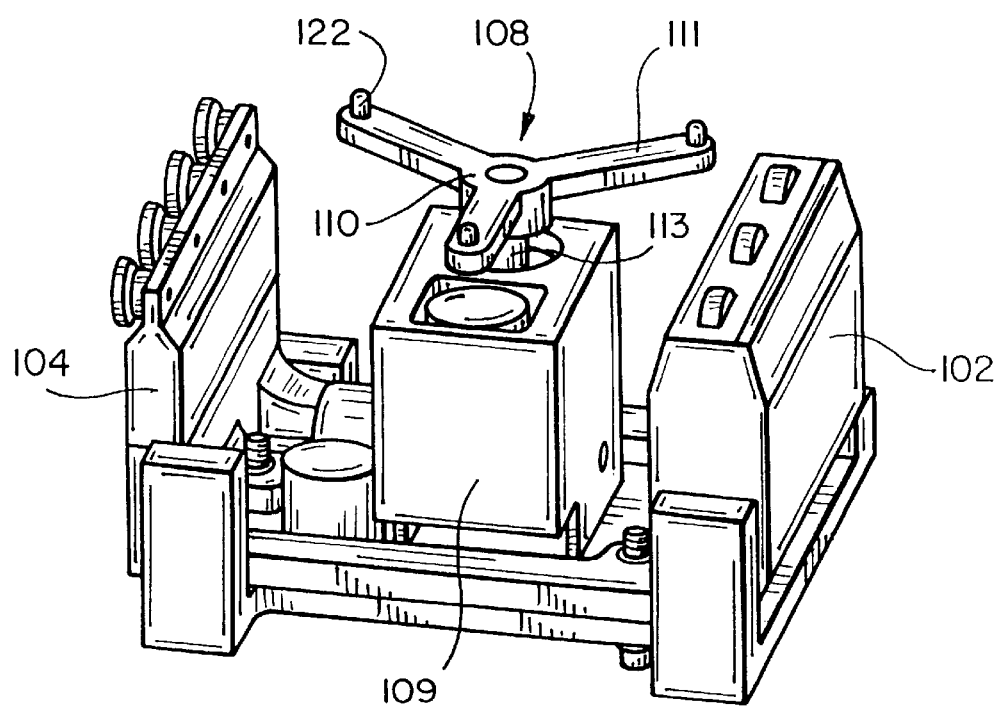
FIG_25

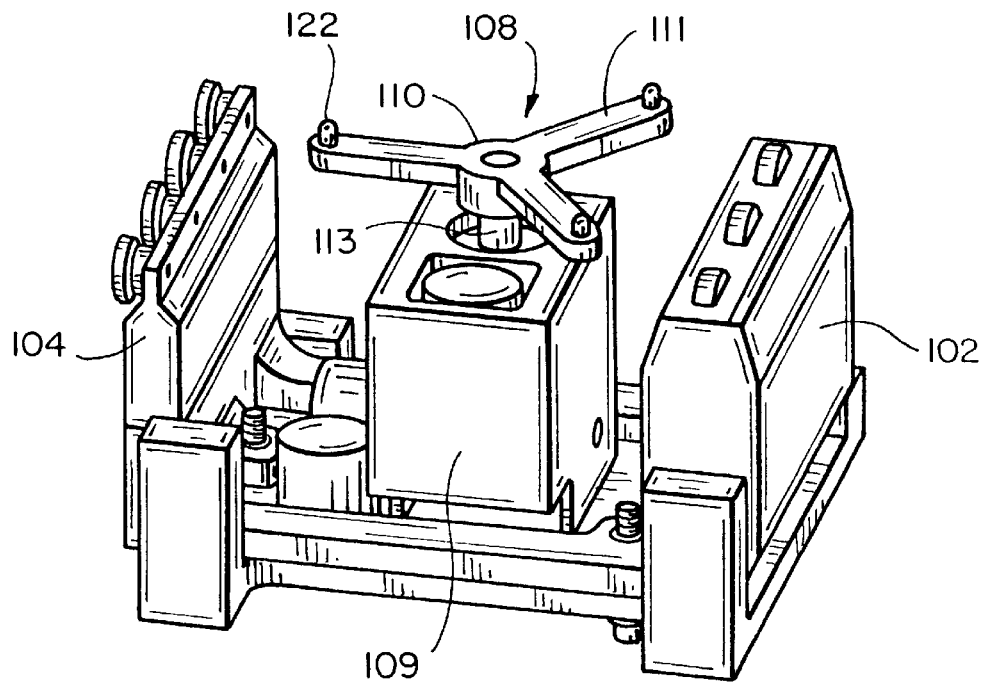
FIG_26
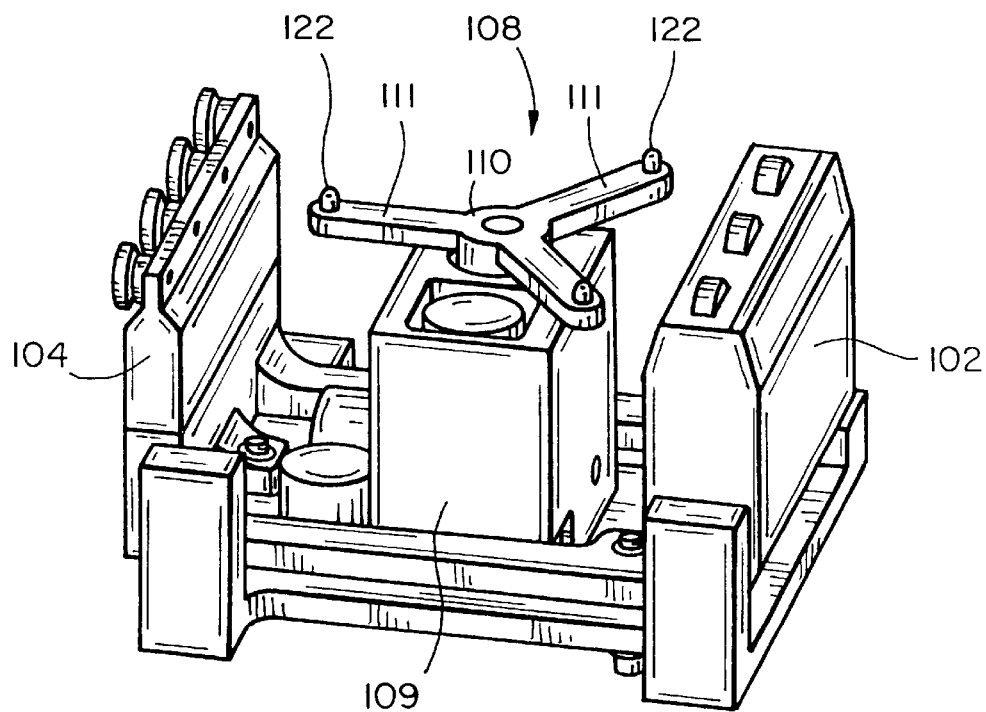
FIG_27

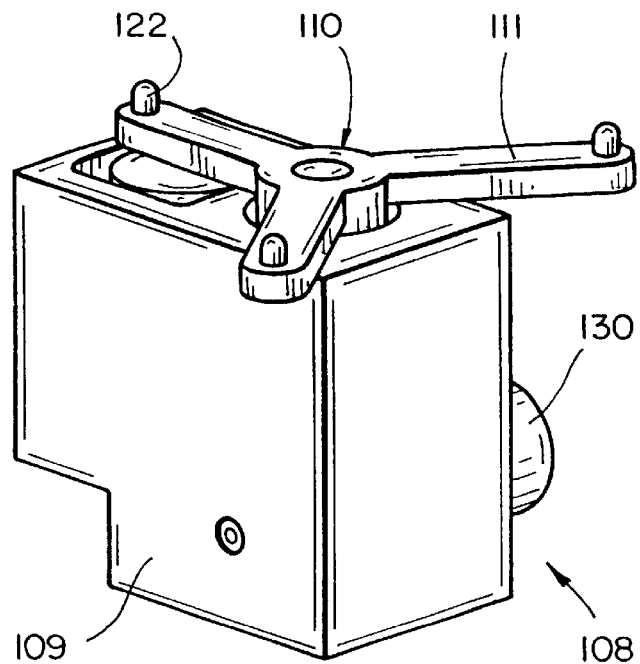
FIG_28a
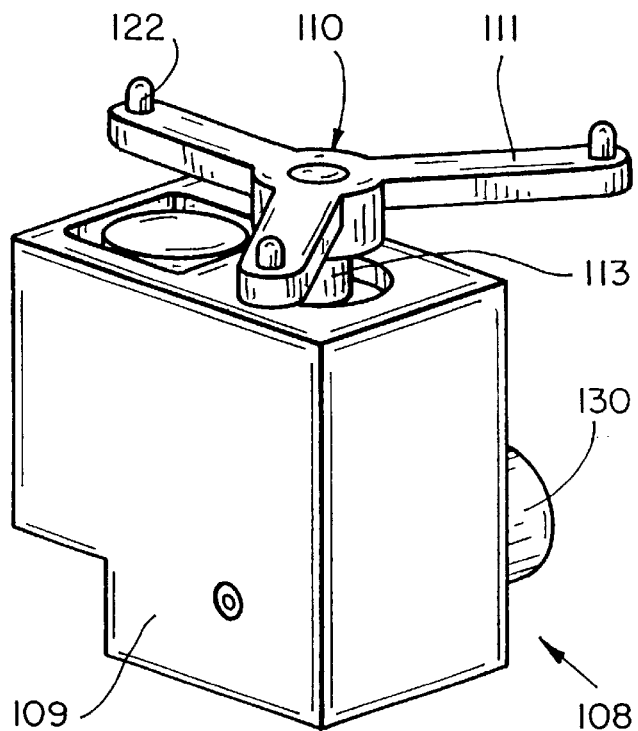
FIG_28b

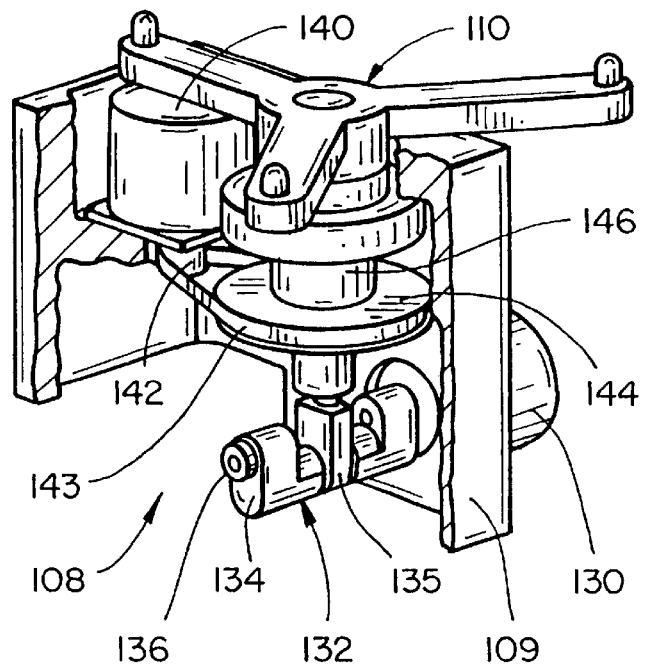
FIG_29a
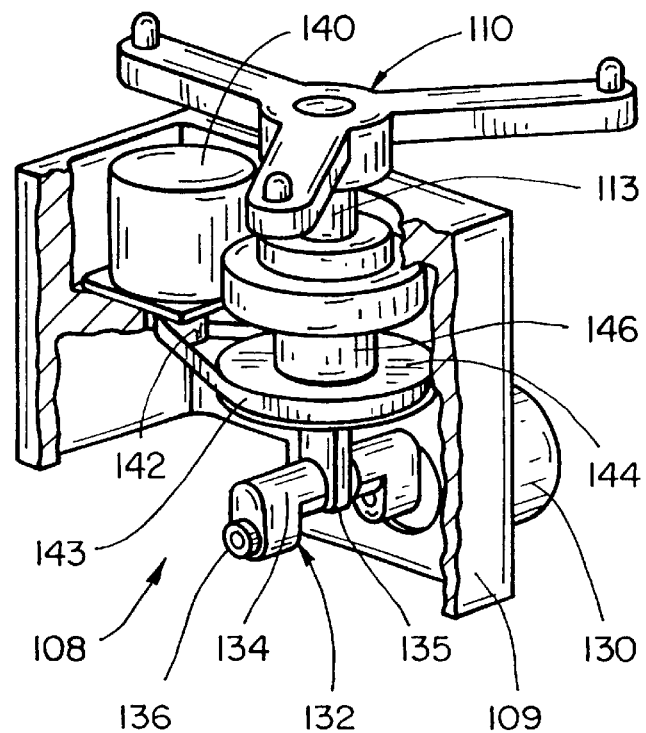
FIG_29b

TRANSPORT SYSTEM WITH INTEGRATED TRANSPORT CARRIER AND DIRECTORS

BRIEF DESCRIPTION OF THE INVENTION

The present invention relates in general to a system of transporting articles between stations and, more particularly, to a transport system having directors for safely directing the travel of delicate or valuable articles.

BACKGROUND OF THE INVENTION

In various fields, delicate or valuable articles must be safely transported between work stations and the like without damaging or destroying the articles. Articles requiring careful handling include, but are not limited to, pharmaceuticals, medical systems, flat panel displays, computer hardware as for example disc drive systems, modems and the like, semiconductor wafers and lithography reticles.

In general, integrated circuits are manufactured by forming a plurality of layers on a substrate such as a semiconductor wafer. A variety of processing machines are used to form the individual layer, with the wafer typically being delivered to several different machines before the integrated circuits are completed. In addition to equipment for depositing films on the wafer, the semiconductor wafer may also be cleaned, conditioned or measured at various stages by suitable equipment. With advances in technology, integrated circuits have become increasingly complex and typically include multiple layers of intricate wiring. The size of the integrated circuits has decreased, greatly increasing the number of such devices on a single wafer. As a result of the increased complexity and decreased size of the integrated circuits, the value of the semiconductor wafer increases substantially as the wafer progresses through the various processing stages. The standard diameter of the semiconductor wafers will increase from 200 mm to 300 mm or larger in the next few years, further increasing the number of integrated circuits which may be formed on a single wafer and therefore the value of each wafer. Considerable care must be taken in handling the semiconductor wafers, particularly during the later processing stages, since a damaged wafer could result in considerable monetary losses. The semiconductor wafers must be retained in a clean room environment, substantially free of particulate contamination, to preserve the purity of the layers deposited on the wafer. The requirement of a clean room environment places additional constraints on the handling of the semiconductor wafers.

For additional protection against contaminants, the semiconductor wafers are typically retained in sealed transport containers, such as pods, as they are moved throughout the manufacturing facility to minimize any exposure to the environment outside of the processing machines. The manufacturing facility is usually organized into a plurality of bays each including several processing machines. After the wafers in a pod have been treated at one or more of the machines, the pod leaves the bay and is transported to the next processing bay. Thus, there are essentially two types of transport loops in the manufacturing facility—the inter-bay loop in which the pods are moved between the bays, and the intra-bay loop in which the pods are moved between the processing machines of a single bay. It is also possible that these two types of transport loops could be merged into one monolithic system with appropriate control and transfer mechanisms (which would eliminate the stocker handoff between the two). In either case, a transport system which may be used to conveniently, safely and efficiently handle and transport the containers is desirable. A transport system which maximizes the utilization of the machines in the processing bay is also desirable.

Various transporting systems have been employed to transport the pods from bay to bay along the inter-bay loop of a manufacturing facility. Because of the amount of traffic in the inter-bay loop of the manufacturing facility, inter-bay transport is typically accomplished via overhead transport systems. The pods are delivered to a robotic storage house, often referred to as a "stocker", which receives the pods and automatically delivers the pods to the intra-bay loop. With some systems, the inter-bay transport system is coupled to the intra-bay transport system for direct transfer between the systems. However, direct transfer may be obtained only when a compatible, overhead transport system is used in the intra-bay loop.

Within the bays, the transport pods must be carried from machine to machine and delivered to a position where the wafers may be unloaded from the pod by the machine for processing. The machine entrance is often provided with a load port where the wafers may be automatically removed from the transport pod in a protected environment. Transferring the pods to the load port requires greater precision and control over the pod than moving the pods between the inter-bay conveyor and the bays. Various methods are employed to move the transport pods between the different processing machines in a bay. For example, many systems rely upon human workers to transfer the transport pods from port to port using a cart. The worker may manually lift the pod to the port. Alternatively, the worker may actuate a manual robotic link or other lifting device to move the pod to the port and, after processing has been completed, to return the transport pod to the cart. The worker then moves the cart to the next machine and repeats the process. Relying on human workers to transport the pods from machine to machine is time consuming and inefficient. Often, the worker will not be on hand to position a pod of fresh wafers in the load port and the machine will sit in a stand-by mode reducing the time during which the machine is operating and the overall efficiency of the processing factory. Moreover, care must be taken to ensure the lifting device is properly aligned with the load port as dropping the pod or exposing the pod to sharp jolts may damage the wafers and could cause up to millions of dollars of damage. A means of automatically moving the transport pods between machines is desirable.

Another system of intra-bay transport relies upon automatic guided vehicles (AGVs) which carry the pods between the machines and move the pods into the load port. Using AGVs reduces the need for a worker in the bay and may increase the speed at which the pods are moved through the bay. However, the size of the bay limits the number of AGVs which may operate in a single bay, leaving the machines in a stand-by mode waiting for the AGV to remove the pod of processed wafers and deposit a pod of fresh wafers in the transfer bay. An automated system which may be used to rapidly deliver pods to and remove pods from the processing machines without leaving the machines in a stand-by mode is desirable.

Overhead monorail systems are also used to transport pods along the intra-bay loop. Hoists or similar devices are used to lower the pods onto the load port of the processing machine. In order to successfully transfer the pod from the monorail to the machine, the pod must be precisely aligned with the load port and lowered onto the port in a controlled manner such that any swing of the pod is minimized. After processing, the pod is raised and transported to the next machine. Repeatedly raising and lowering the pod is challenging. An automated conveyor system which positions the pod for direct, efficient transfer to the load port is desirable.

Transport systems for transporting materials are well known. Examples of standard transport systems include conveyor belt systems and roller systems where the articles are transported across a plurality of rotating rollers or wheels. While these systems provide a useful means of transport in most circumstances, they are not suitable for transporting pods in a clean room environment. Moreover, these systems do not offer precise control over the acceleration and deceleration of the pod which is required to prevent shifting of the wafers within the pods.

Another type of transport system which may be adapted for clean room use includes a pair of spaced rails each having a drive system for supporting an article and propelling the article along the rails. The competition between the two drive systems may cause the article to shimmy as it moves along the rails. a modification of this transport system includes a drive system on one rail and guide wheels on the other rail to allow the article to move freely along the rails. Unless the drive system, guide wheels and features of the transport pod are in exact, horizontal alignment, the guide wheels may cause the article to tip slightly such that each guide wheel imparts a slight impact on the article. While these adverse effects may be a minor inconvenience for most articles, the vibrations can have adverse effects on the delicate, expensive semiconductor wafers carried by the transport pod. A transport system for safely and protectively transporting semiconductor wafers is desirable.

The aforementioned problems are further compounded when the transport carrier is redirected, such as around curves and/or through intersections in the conveyor systems. Space is often at a premium and thus it is often desirable for a transport system to contain turns and the like to better utilize floor space. It is not practical for a transport system to comprise only straight line sections. Further, it is desirable for a transport system to allow for intersections such that the transport carrier can be directed in a variety of ways to different stations in the manufacturing facility. Further, shunts, parallel stocking and queuing zones may be used. Such curves and intersections introduce a discontinuity into the transport system, and thus add all of the attendant problems associated with careful movement of delicate articles. Accordingly, a transport system for safely and protectively transporting and redirecting the travel of semiconductor wafers, such as around corners, curves and through intersections, is desired.

SUMMARY OF THE INVENTION

In summary, the present invention provides a transport system for transporting articles, including a conveyor system having a director and a method of transporting and directing the travel of the articles along the conveyor. The transport system includes an article transport carrier (also referred to as a transport carrier) for carrying one or more articles. The transport carrier may carry a container such as, but not limited to, a transport pod which houses the articles, or the transport carrier may carry the articles directly. The conveyor system also includes a drive rail and a support rail for supporting the transport carrier. The drive rail includes a drive system for propelling the transport carrier between workstations. At least one shoe, such as a wheel, groove or fixed support, is carried by the transport carrier. The shoe is configured to ride on the support rail for movably supporting the transport carrier on the support rail.

Positioned along the conveyor system is a director assembly for directing the transport carrier. Generally, although not necessarily, the director assembly is positioned at a discontinuity in the conveyor. The term "discontinuity" is used broadly herein to make reference to any interruption or change in the path of the conveyor. Interruptions or changes in the conveyor, and thus a discontinuity, include but are not limited to: corners, curves, intersections such as 3-way or 4-way intersections, shunt lines, parallel stocking and queuing zones, the interface between the inter- and intra-bays, and the interface between the conveyor and workstation or other station. In one embodiment of the invention, the director is comprised of two, spaced director rails, where one rail is a director drive rail and the other is a director idler rail. One of said rails is a movable rail for supporting and rotating said transport carrier. In one embodiment, the director drive rail is movable and includes a drive system for engaging the transport carrier. The director idler rail is fixed and is parallel to and spaced from said director drive rail for supporting the transport carrier. A rotor assembly turns the movable rail.

In another embodiment of the present invention, the director assembly is comprised of a pair of spaced director rails positioned below and in between the drive and support rails of the conveyor. The spaced director rails are configured to be raised to support the transport carrier. A rotor assembly having a rotor lifts to engage the transport carrier and rotates to turn the transport carrier to a selected position.

The method of the invention includes the steps of: providing a transport carrier for carrying at least one article and having a base and at least one shoe, positioning the transport carrier with the base of the transport carrier supported on a drive rail and the shoe carried by the transport carrier supported on a support rail of a conveyor system, actuating a drive system carried by the drive rail to propel the transport carrier along the drive rail and support rail, and redirecting the travel of the transport carrier along the conveyor system.

Additional objects and features of the invention will be more readily apparent from the following detailed description and appended claims when taken in conjunction with the drawings.

BRIEF DESCRIPTION OF THE DRAWINGS

FIG. 1 is a schematic view of an example of a conveyor system having an inter-bay loop.

FIG. 2 is a schematic view an a portion of an interbay loop illustrating intersections and corners in the conveyor.

FIG. 3a is a pictorial view of a section of the conveyor system with a transport carrier placed on the conveyor according to one embodiment of the present invention.

FIG. 3b is a pictorial view of a section of the conveyor system with a transport carrier placed on the conveyor is accordance with an alternative embodiment of the present invention.

FIG. 4a is a sectional view taken substantially along the line 4a–4a of FIG. 3a.

FIG. 4b is a sectional view taken substantially along the line 4b–4b of FIG. 3b.

FIG. 5 is an pictorial view of a section of a conveyor having a corner or curve and including an inside director according to one embodiment of the present invention.

FIGS. 6–8 are pictorial views of a section of a conveyor showing a transport carrier positioned on the inside director, rotated by the director, and rotated in a 90 degree position, respectively.

FIG. 9 is an pictorial view of a section of a conveyor showing the transport carrier directed around a curve by the inside director.

FIG. 10 is a top plan view of the insider director section according to the present invention.

FIG. 11 is an pictorial view of a section of a conveyor having a corner or curve and including an outside director according to one embodiment of the present invention.

FIGS. 12–14 are pictorial views of a section of a conveyor showing a transport carrier positioned on the outside director, rotated by the director, and rotated in a 90 degree position, respectively.

FIG. 15 is an pictorial view of a section of a conveyor showing the transport carrier directed around the corner or curve by the outside director.

FIG. 16 is a top plan view of the outside director section according to the present invention.

FIG. 17 is a partially cut away, top plan view of the outside director showing the rotor assembly according to one embodiment of the present invention FIG. 18 is an pictorial view of a section of a conveyor having an intersection and including an intersection director according to yet another embodiment of the present invention.

FIGS. 19 and 20 are pictorial views of a section of a conveyor showing a transport carrier positioned on the intersection director, and rotated by the intersection director, respectively.

FIG. 21 is an enlarged, pictorial view of a section of a conveyor showing the transport carrier directed through the intersection by the intersection director according to one embodiment of the present invention.

FIG. 22 is a top plan view of the intersection director according to the present invention.

FIG. 23 is a partially cut away, top plan view of the intersection director of FIG. 22.

FIG. 24 is a bottom plan view of the outside director showing a portion of the rail drive assembly of the director of FIG. 23.

FIG. 25 is a top plan view of the intersection director in the extended position according to the present invention.

FIG. 26 is a top plan view of the intersection director in the extended and rotated position according to the present invention.

FIG. 27 is a top plan view of the intersection director in the retracted and rotated position according to the present invention.

FIGS. 28a and 28b are cut away pictorial views of the rotor of the intersection director shown in the retracted and extended position, respectively.

FIGS. 29a and 29b are cut away pictorial views of the lift and rotate mechanisms of the intersection director according to one embodiment of the present invention.

DETAILED DESCRIPTION OF THE INVENTION

A detailed description of the invention will now be given with reference to the accompanying figures. Turning now to the drawings, wherein like components are designated by like reference numerals throughout the various figures, attention is directed to FIG. 1.

FIG. 1 shows a possible example of a bay 18 with several processing machines 16. In the field of semiconductor processing, the manufacturing facility is typically organized into a plurality of bays each including several processing machines or work stations 16. The processing machines may include, but are not limited to, equipment for depositing films on the wafers, for cleaning and/or conditioning and/or measuring wafers as various stages, and the like. The bay generally includes a transfer assembly 10 for transferring articles 12 between a conveyor 14 and a work station 16. The entrance to the work stations 16 often has a load port 22 where the articles may be automatically removed from the transport carrier. In one application, described in the illustrated embodiments of the invention, the transfer assembly 10 is used to move transport carriers, which may include pods or other containers housing one or more semiconductor wafers W between the conveyer and the work station. It should be understood, however, that the transfer assembly 10 is not limited to use in semiconductor processing. The transfer assembly may be used to transfer other types of materials, particularly delicate materials requiring substantial care in handling such as pharmaceuticals, medical systems, flat panel displays, hard disk drives, other types of computer components and equipment, lithography reticles and the like. It is to be understood that the transfer assembly and directors of the present invention may be used with any type of articles, including but not limited to containers holding semiconductor wafers or other items, pallets, or articles which may be directly transported by the conveyor without requiring a separate transport carrier.

The conveyor 14 moves the articles 12 from work station 16 to work station 16. In the exemplary embodiment of FIG. 1, the conveyor 14 is arranged in a continuous path around the bay 18. The drive rail 12 and idler rail 14 are arranged in an intra-bay loop 18 which includes one or more cross sections 19 which may be used to transfer the pods 8 from one part of the loop 18 to another without requiring that the pod traverse the entire loop, providing greater flexibility in the movement of the carriers 8. This arrangement may be useful where a manufacturing facility has duplicate processing machines. However, for bays in which each carrier must be delivered to each processing machine in succession, a simple continuous loop is preferred as it leaves the middle of the intra-bay loop 18 free for service and maintenance traffic. Other path configurations of the conveyor 14 may include one or more cross sections, or T shaped sections 21. Such configurations may be used as a holding area to temporarily remove carriers from the main conveyor loop without interrupting the traffic flow of the main loop, as a short-cut to the other area of the bay 18, or as a path to another bay. Yet another path configuration includes the use of shunts, parallel stocking and queuing zones. The configuration of the conveyor 14 is subject to considerable variation depending upon the design and/or constraints of a particular manufacturing facility. An intra-bay conveyor 20 transports the carriers between the bays, with stockers 24 transferring the carriers between the inter-bay conveyor 29 and the conveyor 14.

A section of an intra-bay loop and an inter-bay loop are shown in FIG. 2. While the terms intra-bay loop and inter-bay loop are used in the industry to describe the transport loops, it is possible that these two types of transport loops could be merged into one monolithic system with appropriate control and transfer mechanisms. In either case, as described in more detail below, the conveyor system 10 is particularly suitable for simultaneously transporting a plurality of transport pods 12 or other transport carriers. Eight carriers 8 are shown in FIG. 2 for illustrative purposes. However, it is to be understood that the number of transport carriers 8 carried by the conveyor system 14 may be increased dramatically. In the example shown in FIG. 2, the drive rail 12 and idler rail 14 are arranged in an intra-bay loop 18 which includes one or more intersection cross sections 21, and one or more T intersections 23, in which the pods are directed through the intersections or are directed around sharp corners or curves. To traverse such discontinuities in the conveyor, the invention employs the directors of the present invention.

The conveyor assembly and directors of the present invention are particularly suited for use with a conveyor system of the type shown in co-pending patent application Ser. No. 09/103,479, the entire disclosure of which is incorporated herein by reference. As shown in the Figures, such as in FIGS. 3a and 3b, a section of the conveyor system generally includes a pair of spaced rails 32, and 34 for supporting the transport carrier 12 as it is moved along the conveyor path. The rail 32 functions as a drive rail which propels and optionally may also guide the transport carrier 12 along the rails 32 and 34. Propulsion for moving the carrier 12 is supplied by the drive rail 32. Power may be supplied to the drive rail 32 via conventional means. Alternatively, power may be supplied to the driver rail by a power bus (shown in FIG. 3a). Rail 34 is an idler or support rail. The idler rail 34 supports the transport carrier such that the carrier is held in a level orientation as it is moved along the conveyor path. The conveyor system 14 also includes a transport carrier for moving the articles. In this embodiment, the transport carrier houses the articles. In alternative embodiments, the transport carrier may carry another device such as a container or pod which houses the articles, or even empty containers.

The drive rail 32 includes a drive system, generally designated at 36, for propelling the carrier 12 along the rails 32 and 34. In the illustrated embodiment of the invention, the drive system 36 includes a plurality of wheels 38 which project from the upper surface of the drive rail 34. The drive wheels 38 frictionally engage the underside of the transport carrier to propel the carrier along the drive rail 32. The drive system 36 also includes means for driving the wheels such as motors and belts coupled to the wheels. Preferably, the motors operate independently to provide a plurality of independently controlled drive zones such that the drive speed and direction (forward or reverse) of each zone may be independently controlled. The wheels 38 of adjacent operational zones are accelerated and decelerated such that at the time of transfer, the speed imposed on the transport carrier by the wheels in adjacent zones is synchronized at the time of transfer between the zones. As the carrier is propelled along the conveyor, only the operational zone directly below a carrier and one or more zones adjacent the carrier are in active motion at any time. This reduces the power consumption of the system and extends the operational life of the system 36. The drive zones below and adjacent the other carriers may be held in a stationary mode (sometimes referred to as an inactive mode), allowing a plurality of carriers to accumulate in an area of the conveyor, such as before one of the workstations 16. The operation of the drive system 36 is controlled by a control system. In the preferred embodiment, the control system includes one or more sensors which monitor the progress of the pod along the conveyor.

As shown in FIGS. 4a and 4b, the drive wheel 38 cooperates with the transport carrier 12 to propel and optionally to also guide, the carrier along the conveyor path. The drive wheel 38 engages a groove 40 or other suitable feature formed in the underside of the carrier. The groove 40 defines the horizontal axis in which the carrier sits on the drive wheels 38. The engagement between the drive wheels 38 and the groove 40 controls lateral or side-to-side movement of the carrier as well as vertical movement of the carrier. While the combination of the groove 40 and drive wheels 38 is preferred, it is to be understood that the groove 40 may be eliminated entirely provided the transport carrier, drive rail 32 or idler rail 34 include a guiding feature for guiding the carrier as it moves along the rails 32 and 34.

The idler rail 34 is parallel to and spaced from the drive rail 32. One or more connectors 44 are mounted to the drive and idler rails 32, 34 to maintain a predetermined spacing between the rails and facilitate installation of the conveyor. The drive rail 32 and connectors 44 may be mounted to a suitable mounting frame or suspended from the ceiling by an overhead frame (not shown) or supported directly or indirectly by the process tool workstation. The carrier rides along the upper surface of the idler rail 34, with the idler rail 34 cooperating with the transport carrier to support one side of the transport pod. In the exemplary embodiment, a pad or cushion material 46 is provided alone the upper surface of the rail 34 to provide the carrier with a smoother ride although if desired, the pad 46 may be omitted and the carrier may ride directly on the upper surface of the rail 34. Alternatively, a pad, cushion or a resilient material may be incorporated into the outer perimeter of the drive wheels. At least one shoe 48 carried by the transport carrier (in this instance the transport carrier) rides along the upper surface of the idler rail 34. The shoe 48 is preferably provided by a wheel as shown in FIGS. 3a and 4a. In an alternative embodiment shown in FIGS. 3b and 4b, the shoe 48 is provided by a fixed support 49. In this embodiment, the idler rail 34 includes a plurality of rollers 41 for supporting the fixed support 49. The rollers 41 support the fixed support 49 on the underside of the transport carrier to support the carrier as it travels along the idler rail 34. Preferably, the fixed support 49 will have an anti-friction plastic surface. It should be understood that while two embodiments of the shoe 48 are described, the shoe 48 may take other forms, including but not limited to an air bearing or a magnetic levitation bearing. In yet another embodiment, the idler rail 34 provides guidance as well as supporting the transport carrier. To provide guidance, the shoe 48 or the idler rail 34 includes a guiding feature. One example of where a guiding feature is incorporated into the idler rail is the use of a V-rail. Alternatively, the shoe 48 may incorporate a guiding feature. For example, the shoe 48 may be provided by a fixed support having a groove formed therein, or the groove may be formed in a surface of the carrier, which engages rollers on the idler rail 34. It should be understood that while specific embodiments of the shoe are described, the shoe 48 may take many other forms which provide the function of supporting, or supporting and guiding, the transport carrier. As the carrier is propelled along the conveyor 14, the shoe 48 rides along the idler rail 34 to support the carrier in a manner which minimizes bumping, jolting or shimmying of the carrier, and allows the pod to travel in a smooth, controlled manner.

Although in the preferred embodiment the transfer assembly 10 is used with the conveyor system 14 of co-pending application Ser. No. 09/103,479, it is to be understood that the transfer assembly 10 may also be employed with other types of conveyors.

FIGS. 5–9 show a section of a conveyor system 10, having a conveyor director assembly in accordance with one embodiment of the present invention. Of particular advantage the conveyor system 14 provides a safe, efficient transport mechanism for directing articles or an article transport carrier housing one or more articles, such as through and around discontinuities in the conveyor path. Specifically, as illustrated in FIGS. 5–9, the conveyor path includes a redirected path such as a discontinuity. As stated above, discontinuities are defined broadly herein as any change or interruption in the conveyor path, such as intersections, curves, corners, and the like. Intersections can include four-way cross type intersections, or three way "T-type" intersections as shown in FIGS. 1 and 2. The corner and curve discontinuities may vary widely in their angle. In the illustrated embodiment, a sharp right angle corner is shown; however corners and curves of other angles may be used such as radiuses or accumulating corners. Further discontinuities include shunts, parallel stocking or queuing zones, and interfaces between bays and workstations.

The progression of the transport carrier along the conveyor path and through a right angle corner 50 is shown with reference to FIGS. 5–9, according to one embodiment of the present invention. In FIG. 5, a transport carrier 12 traveling along the conveyor, referred to as the main conveyor, is supported and propelled by the drive 32 and idler 34 rails as described above. For the transport carrier to be directed around the corner, the carrier is positioned on a director assembly 52 which is placed in the path of the main conveyor at the corner. That is, the director is at the location where a redirection of the conveyor path and transport carrier is desired. The main conveyor section upstream of the discontinuity or corner in this case is referred to as the upstream conveyor 37, while the main conveyor section downstream of the discontinuity is referred to as the downstream conveyor 39. Of course, these designations will reverse depending on the direction of travel of the transport carrier.

The director assembly 52 is mounted to a frame, such as the frame of the conveyor, and generally includes a director drive rail section 54, a director idler rail section 56 and a rotor assembly 58. In this example, the director idler rail section 56 is fixed, and curves to propel the carrier in the new direction of travel along the main conveyor. The curve of the director idler rail section 56 is generally configured to the circumference of the turn. The director drive rail section 54 is movable and swings or rotates as shown in FIG. 7 to redirect the transport carrier. In this embodiment, the drive side of the conveyor is on the inside of the turn, and is thus referred to as an inside director. The director drive rail section includes a plurality of drive wheels 57 which project from the upper surface of the director drive rail section. The drive wheels 57 are substantially similar in configuration and function to the wheels 38 on the drive rail 32 of the main conveyor. The wheels 57 frictionally engage the underside of the transport pod to propel the pod along the rail 56. The drive wheels 57 of the director drive rail section are driven by a drive system substantially similar to the drive system 36 of the main conveyor.

The director drive rail 54 rotates until it abuts the drive rail of the downstream main conveyor 39 as shown in FIG. 8. At this point the redirection of the transport carrier is complete and the transport carrier is propelled along the downstream side of the main conveyor 39 as depicted in FIG. 9. The director drive rail section 54 is rotated by a rotor assembly 58, shown in greater detail with reference to FIG. 10. The rotor assembly 58 includes a base 60 having a race 61 formed around a periphery of the base. A rotor 62 is mounted to the base 60. The rotor includes three arm members 63 which include a cam follower 64 at the end of each arm member 63. In the illustrated embodiment, three arm members 63 are used and are equally spaced apart around a 360 degree circumference; however, a different number and orientation may be used. A motor 65 drives the rotor. As the rotor turns, the cam followers rotate along, and are constrained by, the race 61. The director drive rail section 56 is mounted to the rotor 62 which rotates as the rotor turns.

In this embodiment, the director drive rail section 56 may rotate a full 90 degrees. When the transport carrier is in the upstream position on the conveyor, the director drive rail section 56 is positioned such that one end of the rail 56 abuts the upstream drive rail 32 of the main conveyor. This allows the director assembly to receive the transport carrier. After the transport carrier travels onto the director drive rail section 56, the rail 56 rotates until the other end of the rail 56 abuts the downstream drive rail 32 of the main conveyor. Thus, the director drive rail section 56 joins only one side of the main conveyor at a time.

The rotor assembly 58 is driven by a drive system. The drive system (not shown) is substantially identical to the drive system for the rotor assembly 78 described below and in general includes the motor 65, timing pulley, a continuous belt, and a radial bearing. The radial bearing and belt are fixed with respect to the base 60. The motor is coupled to the rotor by the timing pulley and the continuous belt. The motor and belt orbit around a fixed centerline.

Although not shown, the rotor assembly 58 and motor 65 are coupled to a control device which controls activation and operation of the director assembly. The control device is preferably coupled to the control system of the conveyor 14 to synchronize the operation. The control device also controls the angle of rotation of the rotor. The control device is more fully described in co-pending patent application Ser. No. 09/212,002, filed Dec. 14, 1998, the entire disclosure of which is incorporated herein by reference.

Another embodiment of the director of the present invention is illustrated in FIGS. 11–17. In this embodiment, the drive side of the conveyor is positioned toward the outside of the turn, and thus the director is referred to as an "outside director." The progression of a transport carrier along the conveyor and through a discontinuity in the conveyor path. In this instant the discontinuity is a 90 degree right angle turn, is shown in FIGS. 11–15. The transport carrier travels along the main conveyor, upstream of a director assembly 70 and is supported by the drive 32 and idler rails 34 as shown in FIG. 11. To turn the corner, the transport pod travels onto the director assembly 70. The carrier is propelled onto the director assembly 70 by the drive wheels contained in the director drive rail section 72. One or more sensors (not shown) in the director assembly detect when the carrier is positioned on the director, and a control system similar to that described above signals the drive wheels cease operation and the pod comes to a stop as shown in FIG. 12.

To turn the transport carrier, the director 70 outwardly swings or rotates the pod as illustrated in FIGS. 13 and 14. That is, there is a pivoting turn around a passive rail. In the exemplary embodiment the transport carrier is rotated by 90 degrees; however, the transport carrier may be rotated by any desired angle. Once the transport carrier has been redirected, the drive wheels on the director drive rail section 72 again engage the bottom side of the pod and propel the pod along the downstream conveyor as shown in FIG. 15.

The outside director assembly 70 is mounted to the frame of the conveyor and generally includes a director drive rail section 72, a director idler rail section 74, and a rotor assembly 76. The director idler rail section 74 is fixed and is generally configured in a L-shape with a radiussed section. This enables the shoe on the underside of the carrier to remain in contact, and be fully supported by, the director idler rail during the turn. The director drive rail section 72 is movable and swings or rotates as shown in FIG. 14 to redirect the transport carrier. When the transport carrier moves onto the director from the upstream conveyor, one side of the director drive rail section 72 is positioned next to the drive rail of the upstream conveyor. When the director drive rail section 72 rotates to turn the carrier, the rail comes to rest with the other side positioned next to the drive rail of the downstream conveyor.

The director drive rail section 72 is rotated by a rotor assembly 78. The director drive rail 72 is fixedly mounted on the rotor assembly 78, as illustrated in FIGS. 16 and 17. The rotor assembly 78 includes a fixed base 80 having a race 81 formed around an inside periphery of the base 80. The base is fixed to a frame on the conveyor. Mounted atop the base is a rotor 82. In this embodiment the rotor has three outwardly projecting arm members 83. In the exemplary embodiment the arm members are spaced apart at an angle of 120 degrees, however any angle can be used. A cam follower 84 is attached to each end of the three arm members 83. As the rotor turns, the cam followers travel along the race 81. The cam followers allow the pivot point about which the director drive rail section 72 rotates to change as it turns. In this embodiment, the director drive rail section 72 may rotate a full 90 degrees.

The rotor assembly 78 is rotated by drive system, shown in the partially cut away view in FIG. 17. The drive system includes a motor 86, timing pulley 87, a continuous belt 88, and radial bearing 89. The radial bearing 89 and belt 88 are fixed with respect to the base 80. The motor is coupled to the rotor by the timing pulley 87 the continuous belt 88. To rotate the rotor, the motor 86 spins the timing pulley 87 which turns the continuous belt 88 about the radial bearing 89. As the rotor turns, the cam follows at the end of the rotor arms turn around the race 81, allowing the pivot point to change as the rotor turns. The director drive rail section 72 is fixed to the rotor and turns with the rotor. Although not shown, the rotor assembly and motor 86 are coupled to a control device which controls activation and operation of the director assembly. The control device is preferably coupled to the control system of the conveyor 14 to synchronize the operation. The control device also controls the angle of rotation of the rotor and is more fully described in co-pending patent application Ser. No. 09/212,002, filed Dec. 14, 1998, the entire disclosure of which is incorporated herein by reference.

Yet another embodiment of the director of the present invention is shown with reference to FIGS. 18–29. In this embodiment, the director is placed at an intersection in the conveyor path, and is referred to as an "intersection director." A four way intersection is shown; however, the intersection can also be comprised of a three way intersection. With this intersection director embodiment, a main conveyor line is defined as main conveyor 90, while the intersection conveyor line is termed the "spur" conveyor 92. Similarly as defined above, both the main and spur conveyor have an upstream section and a downstream section which are defined in relation to the discontinuity and the direction of travel of the carrier.

The progression of the transport carrier along the conveyor path and into the intersection is shown in FIGS. 18–21. The transport carrier travels along the main conveyor 90 supported by the drive 32 and idler 34 rails as described previously. As the carrier approaches the intersection, the carrier may be directed straight through the intersection, or may directed to the right or to the left along the spur conveyor (the designations right and left are in respect to the main conveyor and the direction of travel of the carrier on the main conveyor). In the illustrated embodiment, the carrier is directed to the left along the spur line 92. Specifically, the carrier stops and is positioned over a director assembly 100. The director assembly is positioned below the main conveyor line and in between the spaced rails 32 and 34 of the main conveyor line, as described in detail below. The director assembly 100 then rotates the carrier by 90 degrees as shown in FIG. 20, and then the drive wheels of the director engage the underside of the carrier and propel the carrier onto the drive wheels of the spur conveyor as shown in FIG. 21. The direction of the drive wheels may reverse, in which instance the carrier would travel in the opposite direction (i.e. to the right) along the spur conveyor. As shown in FIG. 18, the idler rail 34 on the spur conveyor 92 includes one or more rollers 35*a* and 35*b* which abut the drive 32 and idler rail 34 of the main conveyor 90. The rollers 35*a* and 35*b* are used to assist the carrier in traversing a gap between the main 90 and spur 92 conveyors as the carrier is propelled onto the spur conveyor 92.

The intersection director assembly 100 is further illustrated in FIG. 22. The director assembly 100 is positioned below the conveyor between the drive 32 and idler 34 rails so that the transport carrier may pass straight through the intersection without being redirected if desired. The director assembly 10 includes spaced apart director drive rail section 102 and director idler rail section 104, a rail drive system 106, and a rotor assembly 108 having a rotor 110. In general the rails 102 and 104 are lifted and retracted via the rail drive system. The rotor assembly 108 includes a lift mechanism and a rotate mechanism which acts to lift, retract and rotate the rotor 110. When the pod is to be redirected, the rotor 110 engages the pod and lifts and rotates the pod to a new direction. Next, the director drive and idler rails 102 and 104 are extended so that they are substantially flush with the rails 32 and 34 of the main conveyor. Preferably, the rails 102 and 104 are extended in unison. Once the pod is rotated to the desired redirected position, the rotor assembly lowers the pod onto the extended director rails 102 and 104. The pod is now supported by the director rails. The wheels of the director drive rail 102 are actuated and act to engage the underside of the pod and propel the pod along the spur conveyor in the new direction.

A more detailed drawing of the director assembly 100 is depicted in FIGS. 22 to 29. FIGS. 22 and 23 shows the director assembly 100 in the retracted position. Both the director drive and idler rails 102 and 104, and the rotor 110 are retracted. The director rails 102 and 104 are carried by a frame body 112 positioned below the rails. The director drive and idler rails 102 and 104 are extended in unison by a rail drive system. The rail drive system includes a plate 114, a plurality of lead screws 115, and a motor system 116. The director drive rail 102 and idler rail 104 are mounted to the plate 114. The plate 114 includes a plurality of threaded holes 117 which are engaged by the lead screws 115. A motor 120 drives the lead screws 115 though a continuous belt 118 and timing pulleys 120*a*, 120*b* and 120*c* (FIG. 24) to extend and the retract the plate 114 via the threaded holes 117, thereby raising and lowering the drive and idler rails 102 and 104. Idler pulley 121 is employed to keep the belt 118 in tension. In the illustrated embodiment, three lead screws 115 are shown; however, it is to be understood that any appropriate number may be used. Also, although one lift mechanism is shown, and it should be understood by those of ordinary skill in the art that other types of lift mechanisms may be employed to raise and lower the director rails.

To rotate the pod a rotor assembly 108 is employed as illustrated in FIGS. 25–29. The rotor assembly 108 includes a housing 109 containing a rotor 110 and a lift and rotate mechanism. The housing is fixed and mounted to a frame on the conveyor. In principle, the rotor assembly operates to lift and rotate the transport carrier to a desired redirected position. The rotor assembly may rotate a full 360 degrees and thus, may redirect to pod to any desired angle. As shown in FIG. 25 the rotor 110 is extended by a shaft 113. The rotor may extend any suitable distance, and in the exemplary embodiment, the rotor is lifted approximately 2 inches. FIG. 26 shows the rotor 110 in a rotated position in relation to its position in FIG. 25. In general the rotor 110 includes a plurality of arm members 120. Three arm members 120 are shown; however different numbers of arm members may be used. At the end of each arm member is a retainer 122, which projects upwardly from the top surface of the arm member 120. The retainers 122, also referred to as kinematic pins, engage grooves or slots on the underside of the transport carrier and act to position the transport carrier on the rotor and to secure the transport carrier as it is lifted and rotated.

Once the transport carrier is lifted and rotated to the desired position, the director drive and idler rails 102 and 104 are raised and the rotor 110 is then retracted and lowers the transport carrier onto the director drive and idler rails 102 and 104. This position of the director assembly 100 is illustrated in FIG. 27, which shows the rotor in the retracted position and the director drive and idler rails in the raised position. The director drive and idler rails 102 and 104 support the redirected transport carrier. The transport carrier is then engaged by the drive wheels on the director drive rail 102 and is propelled down the conveyor. After the transport carrier has moved onto the conveyor, the director drive and idler rails 102 and 104 are lowered such they are positioned below the main conveyor.

Operation of the director assembly is controlled by a control system (not shown) which is coupled to the rail drive system and the rotor lift and rotate mechanisms. The control system includes a plurality of sensors (not shown) which detect the position of the transport carrier at various locations. When a transport carrier to be redirected is positioned above the director assembly the control system sends a signal to actuate the lift mechanisms to extend the rotor 110 and to engage the transport pod. Once the pod is fully extended, the control system actuates the rotate mechanism and commands the rotate mechanism to turn the rotor to a selected position. Once the rotor has turned to the proper position, the control system actuates the rail drive system to raise the director drive and idler rails to their extended position. Next, the control system actuates the lift mechanism again, in this instance to lower the rotor. This lowers the transport carrier onto the director drive and idler rails, and the transport carrier may now move along the redirected conveyor path. Once the transport carrier has moved away from the director drive and idler rails, the control system actuates the rail drive system to retract the drive and idler rials 102 and 104 into the lowered positioned.

The rotor assembly 108 is shown in further detail with reference to FIGS. 28a–28b, and 29a–29b. The rotor assembly includes a lift mechanism and a rotate mechanism. The lift mechanism is comprised generally of a motor 130, a crank assembly 132 and a spline shaft 113. The crank assembly 132 controls the height of the rotor 110 in its extended position. The rotor 110 is attached to the spline shaft 113. The crank assembly 132 has a crank shaft 134 which is coupled to a connecting rod 135 having a socket formed therein. The spline shaft 134 includes a ball formed on the end of the end of the spline shaft 134, and thus, the spline shaft 134 is coupled to the crank shaft via the ball and socket. To raise and lower the rotor 110, the motor 130, preferably a stepper motor, rotates the crank shaft around a centerline axis 136 of the motor 130. In the lowered position, as shown in FIG. 29a, the crank shaft is positioned below the centerline axis; and the raised position as shown in FIG. 29b, the crank shaft is positioned above the centerline axis.

To turn the transport carrier, the rotor assembly employs a rotate mechanism. The rotor mechanism includes a shaft with a spline (preferably the same spline shaft 113 as used in the lift mechanism) and a motor assembly. The motor assembly generally includes a motor 142 include a timing pulley 142 and a continuous belt 143. The belt 143 is coupled to another pulley 144 which is attached to the rotor of a bearing 146. The motor rotates the rotor of the bearing 146 to any desired position. The bearing imparts the rotation to the rotor 110 via the spline shaft 113 and a mating linear bearing (not shown). Further, a radial bearing (not shown) is integrated into the top of the spline shaft 113 to allow the spline to rotate. A number of commercially available spline shafts are suitable, such as an NB Rotary Ball Spline. As described, the rotor assembly 108 imparts both lift and rotation to the rotor 110.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best use the invention and various embodiments with various modifications as are suited to the particular use contemplated. It is intended that the scope of the invention be defined by the claims appended hereto and their equivalents.

What is claimed is:

1. A transport system for transporting articles comprising:
    a transport carrier for carrying at least one article between workstations;
    a conveyor having a drive rail for supporting said transport carrier, said drive rail including a drive system for propelling said transport carrier along the conveyor;
    a support rail parallel to and spaced from said drive rail for supporting said transport carrier;
    at least one shoe carried by said transport carrier, said shoe being configured to ride on said support rail for movably supporting said transport carrier on said Support rail; and
    a director assembly for directing the transport carrier along the conveyor, the director assembly having a pair of spaced director rails positioned below and in between the drive and support rails of the conveyor, said spaced director rails being configured to be raised to support the transfer device, and
    a rotor assembly having a rotor which lifts to engage the transport carrier and rotates to turn the transport carrier to a selected position.

2. The transport system of claim 1 wherein the director assembly directs the transport carrier into an intersection in the conveyor.

3. The transport system of claim 1 wherein one of the spaced director rails is a director drive rail including a drive system for engaging the transport carrier, and the other spaced director rail is a director idler rail for supporting the transport carrier.

4. The transport system of claim 3 in which said drive system includes a plurality of drive wheels and at least one motor for driving said drive wheels.

5. The transport system of claim 1 wherein the rotor assembly may rotate the transport carrier at an angle in the range of approximately 0 to 180 degrees.

6. The transport system of claim 1 wherein the rotor assembly further comprises:
   a rotor having a plurality of arm members;
   a plurality of retainers, one of said retainers positioned on the end of each of said arm members;
   a lift mechanism for lifting the rotor; and
   a rotate mechanism for turning the rotor to a selected position.

7. The transport system of claim 1 further comprising:
   a director rail drive system for raising and lowering the director rails which includes a plate attached to the director rails, said plate having a plurality of threaded holes formed therein;
   a plurality of lead screws, one lead screw positioned within each of the holes in the plate; and
   a motor having a timing pulley system and a continuous belt coupled to each of the lead screws for actuating the lead screws to raise and lower the plate, thereby moving the director rails.

8. The transport system of claim 1 wherein the shoe is comprised of a wheel.

9. The transport system of claim 1 wherein the shoe is comprised of a fixed support.

10. The transport system of claim 1 wherein the shoe is comprised of a groove.

11. A method of transporting articles comprising the steps of:
    providing a transport carrier for holding at least one article and having a base and at least one shoe carried by the base;
    positioning the transport device with the base of the transport carrier supported on a drive rail and the shoe carried by the transport carrier supported on a support rail of a conveyor system;
    actuating a drive system carried by the drive rail to propel the transport carrier along the drive rail and support rail; and
    redirecting the transport carrier as it travels along the conveyor system by lifting a pair of spaced director rails positioned below and in between the drive and support rails to support the transport carrier; and
    rotating the transport carrier to a selected position.

12. The method of claim 11 wherein the transport carrier is redirected through an intersection in the conveyor system.

* * * * *